US011145645B2

(12) United States Patent
Xiao et al.

(10) Patent No.: US 11,145,645 B2
(45) Date of Patent: *Oct. 12, 2021

(54) MULTI-STACK THREE-DIMENSIONAL MEMORY DEVICES

(71) Applicant: YANGTZE MEMORY TECHNOLOGIES CO., LTD., Wuhan (CN)

(72) Inventors: Li Hong Xiao, Wuhan (CN); Bin Hu, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 35 days.

This patent is subject to a terminal disclaimer.

(21) Appl. No.: 16/783,152

(22) Filed: Feb. 5, 2020

(65) Prior Publication Data

US 2020/0176443 A1     Jun. 4, 2020

Related U.S. Application Data

(63) Continuation of application No. 16/194,263, filed on Nov. 16, 2018, now Pat. No. 10,600,781, which is a
(Continued)

(51) Int. Cl.
*H01L 23/02* (2006.01)
*H01L 27/06* (2006.01)
(Continued)

(52) U.S. Cl.
CPC ............ *H01L 27/0688* (2013.01); *G11C 5/02* (2013.01); *G11C 5/06* (2013.01); *G11C 16/0483* (2013.01);
(Continued)

(58) Field of Classification Search
CPC ............. H01L 21/8221; H01L 23/3114; H01L 27/101; H01L 27/11565; H01L 27/0688;
(Continued)

(56) References Cited

U.S. PATENT DOCUMENTS 10,074,667 B1    9/2018 Higashi et al.
10,115,681 B1 * 10/2018 Ariyoshi ........... H01L 27/11524
(Continued)

FOREIGN PATENT DOCUMENTS

CN     1550012 A    11/2004
CN   101197185 A     6/2008
(Continued)

OTHER PUBLICATIONS

International Search Report issued in corresponding International Application No. PCT/CN2018/106696, dated Jun. 12, 2019, 5 pages.
(Continued)

*Primary Examiner* — Luan C Thai
(74) *Attorney, Agent, or Firm* — Bayes PLLC

(57) ABSTRACT

Embodiments of three-dimensional (3D) memory devices having multiple memory stacks and methods for forming the 3D memory devices are disclosed. In an example, a 3D memory device includes a first device chip, a second device chip, and a bonding interface. The first device chip includes a peripheral device and a first interconnect layer. The second device chip includes a substrate, two memory stacks disposed on opposite sides of the substrate, two memory strings each extending vertically through one of the two memory stacks, and a second interconnect layer. The bonding interface is formed vertically between the first interconnect layer of the first device chip and the second interconnect layer of the second device chip.

20 Claims, 13 Drawing Sheets

Related U.S. Application Data continuation of application No. PCT/CN2018/106696, filed on Sep. 20, 2018.

(51) Int. Cl.

| | | |
|---|---|---|
| *G11C 5/02* | (2006.01) | |
| *G11C 5/06* | (2006.01) | |
| *G11C 16/04* | (2006.01) | |
| *H01L 21/822* | (2006.01) | |
| *H01L 23/31* | (2006.01) | |
| *H01L 27/10* | (2006.01) | |
| *H01L 27/11551* | (2017.01) | |
| *H01L 27/11565* | (2017.01) | |
| *H01L 27/11578* | (2017.01) | |

(52) U.S. Cl.
CPC ...... *H01L 21/8221* (2013.01); *H01L 23/3114* (2013.01); *H01L 27/101* (2013.01); *H01L 27/11551* (2013.01); *H01L 27/11565* (2013.01); *H01L 27/11578* (2013.01)

(58) Field of Classification Search
CPC ......... H01L 27/11551; H01L 27/11578; G11C 5/02; G11C 5/06; G11C 16/0483
USPC .......................................... 257/686; 438/109
See application file for complete search history.

(56) References Cited

U.S. PATENT DOCUMENTS

| | | | |
|---|---|---|---|
| 10,600,781 B1 * | 3/2020 | Xiao | .................. H01L 21/8221 |
| 2002/0075719 A1 | 6/2002 | Johnson et al. | |
| 2010/0320526 A1 | 12/2010 | Kidoh et al. | |
| 2019/0189632 A1 | 6/2019 | Lee et al. | |

FOREIGN PATENT DOCUMENTS

| | | |
|---|---|---|
| CN | 101312199 A | 11/2008 |
| CN | 102610615 A | 7/2012 |
| CN | 103828046 A | 5/2014 |
| CN | 105074923 A | 11/2015 |
| CN | 106653684 A | 5/2017 |
| CN | 106920772 A | 7/2017 |
| CN | 106920796 A | 7/2017 |
| CN | 107658315 A | 2/2018 |
| CN | 107658317 A | 2/2018 |
| CN | 107706182 A | 2/2018 |
| CN | 108377660 A | 8/2018 |
| CN | 108475681 A | 8/2018 |
| CN | 108511358 A | 9/2018 |

OTHER PUBLICATIONS

Written Opinion of the International Searching Authority issued in corresponding International Application No. PCT/CN2018/106696, dated Jun. 12, 2019, 4 pages.

* cited by examiner

US 11,145,645 B2

MULTI-STACK THREE-DIMENSIONAL MEMORY DEVICES

CROSS REFERENCE TO RELATED APPLICATION

This application is continuation of U.S. application Ser. No. 16/194,263, filed on Nov. 16, 2018, entitled "MULTI-STACK THREE-DIMENSIONAL MEMORY DEVICES," which is continuation of International Application No. PCT/CN2018/106696, filed on Sep. 20, 2018, entitled "MULTI-STACK THREE-DIMENSIONAL MEMORY DEVICES," both of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory device having multiple memory stacks and fabrication methods thereof are disclosed herein.

In one example, a 3D memory device includes a first device chip, a second device chip, and a bonding interface. The first device chip includes a peripheral device and a first interconnect layer. The second device chip includes a substrate, two memory stacks disposed on opposite sides of the substrate, two memory strings each extending vertically through one of the two memory stacks, and a second interconnect layer. The bonding interface is formed vertically between the first interconnect layer of the first device chip and the second interconnect layer of the second device chip.

In another example, a 3D memory device includes a first device chip, a second device chip, and a bonding interface. The first device chip includes a peripheral device and a first interconnect layer. The second device chip includes a substrate, a memory stack formed on the substrate and comprising two memory decks disposed one over another, two memory strings each extending vertically through one of the two memory decks, and a second interconnect layer. The bonding interface is formed vertically between the first interconnect layer of the first device chip and the second interconnect layer of the second device chip.

In still another example, a method for forming a 3D memory device is disclosed. A peripheral device is formed on a first chip substrate. A first interconnect layer is formed above the peripheral device on the first chip substrate. A first memory stack is formed on a first side of a second chip substrate. A first memory string extending vertically through the first memory stack is formed. A second memory stack is formed on a second side opposite to the first side of the second chip substrate. A second memory string extending vertically through the second memory stack is formed. A second interconnect layer is formed above one of the first and second memory stacks. The first chip substrate and the second chip substrate are bonded at a bonding interface between the first interconnect layer and the second interconnect layer.

In yet another example, a method for forming a 3D memory device is disclosed. A peripheral device is formed on a first chip substrate. A first interconnect layer is formed above the peripheral device on the first chip substrate. A memory stack including two memory decks formed one over another is formed on a second chip substrate. Two memory strings each extending vertically through one of the two memory decks are formed. A second interconnect layer is formed above the memory stack. The first chip substrate and the second chip substrate are bonded at a bonding interface between the first interconnect layer and the second interconnect layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
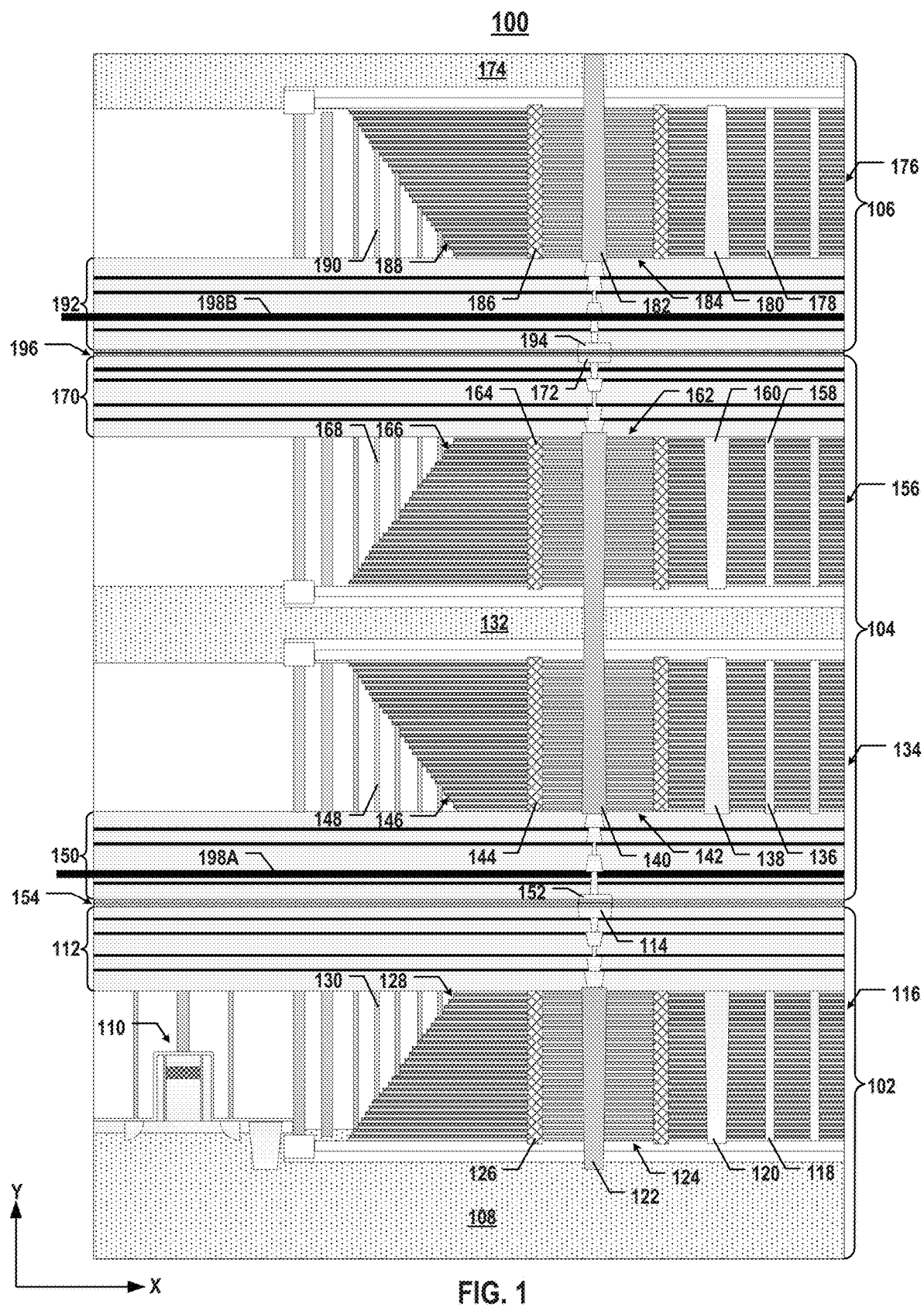
FIG. 1 illustrates a cross-section of an exemplary 3D memory device having multiple memory stacks, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

As 3D NAND memory technology continues to scale up (e.g., towards 128 levels and beyond), it is no longer feasible to form channel holes and gate line slits (GLSs) by a single etching step due to process limitation of dry etching techniques. On the other hand, the precise control and further reduction of critical dimension of small-size patterns, like channel holes, are desirable for increasing memory cell density.

Various embodiments in accordance with the present disclosure provide 3D memory devices having multiple memory stacks. The multi-stack 3D memory devices can be formed by hybrid bonding of multiple device chips in any suitable stack sequences, which can significantly increase process window for better critical dimension control and relaxed lithography alignment and overlay specification, thereby improving the production throughput and yield. In some embodiments, the device chips include double-sided memory array device chips each having two memory stacks on both sides of the substrate. In some embodiments, the device chips include multi-deck memory array device chips each having multiple memory decks in one memory stack. In some embodiments, the peripheral device chip also includes memory stacks to further increase the number of memory stacks that can be integrated into the resulting 3D memory device. The multi-stack architecture disclosed herein can be easily extendable to two-, three-, four-, or even more memory stacks.

FIG. 1 illustrates a cross-section of an exemplary 3D memory device 100 having multiple memory stacks, according to some embodiments of the present disclosure. As shown in FIG. 1, 3D memory device 100 can be a three-chip memory device including a peripheral device chip 102 and two memory array device chips 104 and 106 stacked vertically as well as electrically and mechanically connected using bonding techniques, such as hybrid bonding. 3D memory device 100 represents an example of a non-monolithic 3D memory device. The term "non-monolithic" means that the components of a 3D memory device (e.g., the peripheral device and memory array devices) can be formed separately on different substrates and then joined, for example, by bonding techniques, to form the 3D memory device. It is understood that bonding techniques can provide flexibility of connecting any number of device chips in any vertical arrangement to increase the cell density and production yield of 3D memory device 100. It is also understood that 3D memory device 100 can have more than two memory array device chips to further increase the cell density. It is further understood that the peripheral device chip and memory array device chips can be stacked in any order. For example, peripheral device chip 102 can be disposed at the bottom, at the top, or in the middle of 3D memory device 100.

In some embodiments, peripheral device chip 102 includes a substrate 108, which can include silicon (e.g., single crystalline silicon), silicon germanium (SiGe), gallium arsenide (GaAs), germanium (Ge), silicon on insulator (SOI), or any other suitable materials. Peripheral device chip 102 can also include a peripheral device on substrate 108. The peripheral device can be formed "on" substrate 108, in which the entirety or part of the peripheral device is formed in substrate 108 (e.g., below the top surface of substrate 108) and/or directly on substrate 108. The peripheral device can include a plurality of transistors 110 formed on substrate 108. Isolation regions (e.g., shallow trench isolations (STIs)) and doped regions (e.g., source regions and drain regions of transistors 110) can be formed in substrate 108 as well.

The peripheral device can include any suitable digital, analog, and/or mixed-signal peripheral circuits used for facilitating the operation of 3D memory device 100. For example, the peripheral device can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, the peripheral device is formed on substrate 108 using complementary metal-oxide-semiconductor (CMOS) technology (peripheral device chip 102 is thus known as a "CMOS chip").

Peripheral device chip 102 can include an interconnect layer 112 (referred to herein as a "peripheral interconnect layer") above transistors 110 to transfer electrical signals to and from transistors 110. Peripheral interconnect layer 112 can include a plurality of interconnects (also referred to herein as "contacts"), including lateral interconnect lines and vertical interconnect access (via) contacts. As used herein, the term "interconnects" or "contacts" can broadly include any suitable types of interconnects, such as middle-end-of-line (MEOL) interconnects and back-end-of-line (BEOL) interconnects. Peripheral interconnect layer 112 can further include one or more interlayer dielectric (ILD) layers (also known as "intermetal dielectric (IMD) layers") in which the interconnect lines and via contacts can form. The interconnect lines and via contacts in peripheral interconnect layer 112 can include conductive materials including, but not limited to, tungsten (W), cobalt (Co), copper (Cu), aluminum (Al), silicides, or any combination thereof. The ILD layers in peripheral interconnect layer 112 can include dielectric materials including, but not limited to, silicon oxide, silicon nitride, silicon oxynitride, low dielectric constant (low-k) dielectrics, or any combination thereof.

In some embodiments, peripheral interconnect layer 112 further includes, in its top portion, a plurality of bonding contacts 114 and bonding dielectrics electrically isolating bonding contacts 114. Bonding contacts 114 can include conductive materials including, but not limited to, W, Co, Cu, Al, silicides, or any combination thereof. The bonding dielectrics can include, but not limited to, silicon oxide, silicon nitride, silicon oxynitride, low-k dielectrics, or any combination thereof. Bonding contacts 114 and bonding dielectrics of peripheral interconnect layer 112 can be used for hybrid bonding as described below in detail.

It is noted that x and y axes are included in FIG. 1 to further illustrate the spatial relationship of the components in 3D memory device 100. Substrate 108 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 108) in the y-direction (i.e., the vertical direction) when the substrate is positioned in the lowest plane of the semiconductor device in the y-direction. The same notion for describing spatial relationship is applied throughout the present disclosure.

In some embodiments, peripheral device chip 102 includes only peripheral devices, but not any memory array devices. It is understood that in some embodiments, peripheral device chip 102 further includes memory array devices, such as a memory stack 116 beside the peripheral device (e.g., transistors 110), as shown in FIG. 1. It is understood that the relative positions of the peripheral device (e.g., transistors 110) and the memory array device (e.g., memory stack 116) are not limited to the example shown in FIG. 1. The memory array device (e.g., memory stack 116) can be disposed above or below the peripheral device (e.g., transistors 110). That is, in peripheral device chip 102, the memory array device and peripheral device can be stacked vertically on substrate 108 in any order.

As shown in FIG. 1, memory stack 116 can include a plurality of pairs each including a conductor layer and a dielectric layer (referred to herein as "conductor/dielectric layer pairs"). The conductor layers and dielectric layers in memory stack 116 can alternate in the vertical direction. The conductor layers in memory stack 116 can include conductive materials including, but not limited to, W, Co, Cu, Al, doped silicon, silicides, or any combination thereof. The dielectric layers in memory stack 116 can include dielectric materials including, but not limited to, silicon oxide, silicon nitride, silicon oxynitride, or any combination thereof.

In some embodiments, 3D memory device 100 is a NAND Flash memory device in which memory cells are provided in the form of NAND memory strings. As shown in FIG. 1, peripheral device chip 102 can include an array of NAND memory strings 118 each extending vertically through memory stack 116. In some embodiments, each NAND memory string 118 can include a semiconductor channel and a composite dielectric layer (also known as a "memory film"). The semiconductor channel can include silicon, such as amorphous silicon, polysilicon, or single crystalline silicon. The composite dielectric layer can include a tunneling layer, a storage layer (also known as "charge trap/storage layer"), and a blocking layer. Each NAND memory string 118 can have a cylinder shape (e.g., a pillar shape). The semiconductor channel, tunneling layer, storage layer, and blocking layer are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof.

In some embodiments, NAND memory strings 118 further include a plurality of control gates (each being part of a word line). Each conductor layer in memory stack 116 can act as a control gate for each memory cell of NAND memory string 118. Each NAND memory string 118 can include a source select gate at its lower end and a drain select gate at its upper end. As used herein, the "upper end" of a component (e.g., memory NAND string 118) is the end farther away from substrate 108 in the y-direction, and the "lower end" of the component (e.g., NAND memory string 118) is the end closer to substrate 108 in the y-direction.

In some embodiments, peripheral device chip 102 further includes a gate line slit ("GLS") 120 that extends vertically through memory stack 116. GLS 120 can be used to form the conductor/dielectric layer pairs in memory stack 116 by a gate replacement process. In some embodiments, GLS 120 is firstly filled with dielectric materials, for example, silicon oxide, silicon nitride, or any combination thereof, for separating the NAND memory string array into different regions (e.g., memory fingers and/or memory blocks). Then, GLS 120 can be filled with conductive and/or semiconductor materials, for example, W, Co, polysilicon, or any combination thereof, for electrically controlling an array common source (ACS).

In some embodiments, memory stack 116 includes a dielectric structure 124 having a plurality of dielectric layer pairs, i.e., interleaved dielectric layers with two different dielectric materials, such as silicon oxide and silicon nitride. Peripheral device chip 102 can further include a barrier structure 126 extending vertically through memory stack 116. Barrier structure 126 can laterally separate memory stack 116 into dielectric layer pairs (dielectric structure 124) and conductor/dielectric layer pairs. That is, barrier structure 126 is the boundary between dielectric layer pairs (dielectric structure 124) and conductor/dielectric layer pairs, according to some embodiments. Dielectric structure 124 can be enclosed laterally by at least barrier structure 126. Barrier structure 126 can include dielectric materials, such as silicon oxide or silicon nitride.

As shown in FIG. 1, peripheral device chip 102 can further include a through array contact (TAC) 122 extending vertically through dielectric structure 124 of memory stack 116. TAC 122 can be formed only inside dielectric structure 124 enclosed laterally by at least barrier structure 126. That is, TAC 122 can extend vertically through dielectric layers (e.g., silicon oxide layers and silicon nitride layers), but not through any conductor layers. TAC 122 can extend through the entire thickness of memory stack 116, (e.g., all the dielectric layer pairs in the vertical direction). In some embodiments, TAC 122 further extends through at least part of substrate 108. TAC 122 can carry electrical signals from and/or to peripheral device chip 102, such as part of the power bus, with shortened interconnect routing. In some embodiments, TAC 122 can provide electrical connections between the peripheral device (e.g., transistors 110) and the memory array devices (e.g., NAND memory strings 118) in peripheral device chip 102 and/or between peripheral device chip 102 and each of memory array device chips 104 and 106. TAC 122 can also provide mechanical support to memory stack 116. In some embodiments, TAC 122 includes a vertical opening through dielectric structure 124 of memory stack 116, which is filled with conductive materials, including, but not limited to, W, Co, Cu, Al, doped silicon, silicides, or any combination thereof.

In some embodiments, memory stack 116 includes a staircase structure 128 at one side of memory stack 116 in the lateral direction to fan-out the word lines. Staircase structure 128 can tilt toward the center of memory stack 116 to fan-out the word lines in the vertical direction away from substrate 108. Peripheral device chip 102 further includes local contacts to electrically connect the peripheral device and memory array device to peripheral interconnect layer 112. In some embodiments, as part of the local contacts, word line contacts 130 extend vertically within one or more ILD layers. Each word line contact 130 can have an upper end in contact with peripheral interconnect layer 112 and a lower end in contact with a corresponding conductor layer in memory stack 116 at staircase structure 128 to individually address a corresponding word line of the memory array device. In some embodiments, the local contacts, including word line contacts 130, include contact holes and/or contact trenches filled with conductive materials, such as W, Co, Cu, Al, silicides, or any combination thereof.

As shown in FIG. 1, first memory array device chip 104 can be disposed above peripheral device chip 102. In some embodiments, first memory array device chip 104 is disposed below peripheral device chip 102. First memory array device chip 104 can be a double-sided memory array device chip that includes at least two memory stacks on opposite sides of the chip substrate, respectively. It is understood that first memory array device chip 104 is not limited to a double-sided memory array device chip and can be any memory array device chip that includes at least one memory stack. Different from peripheral device chip 102, first memory array device chip 104 includes only memory array devices, but not any peripheral device, according to some embodiments.

First memory array device chip 104 can include a substrate 132, which can include silicon (e.g., single crystalline silicon), SiGe, GaAs, Ge, SOU or any other suitable materials. In some embodiments, substrate 132 is a thinned substrate. Substrate 132 can include two opposite sides—an upper side and a lower side—on which two memory stacks 134 and 156 are formed, respectively. As shown in FIG. 1, first memory array device chip 104 can include memory stack 134 disposed on the lower side of substrate 132, i.e., below substrate 132. Similar to the counterparts of peripheral device chip 102, first memory array device chip 104, on its lower side of substrate 132, can further include an array of NAND memory strings 136, a GLS 138, a dielectric structure 142 of memory stack 134 enclosed by a barrier structure 144, a staircase structure 146 of memory stack 134, and word line contacts 148.

In some embodiments, each NAND memory string 136 extends vertically through memory stack 134 and is disposed below substrate 132. Each NAND memory string 136 can include a source select gate at its upper end and a drain select gate at its lower end. In some embodiments, GLS 138 extends vertically through memory stack 134 and is disposed below substrate 132. GLS 138 can separate the NAND memory string array into different regions (e.g., memory fingers and/or memory blocks) and/or electrically control an ACS. In some embodiments, dielectric structure 142 is disposed below substrate 132 and laterally separates memory stack 134 into dielectric layer pairs (dielectric structure 142) and conductor/dielectric layer pairs through which NAND memory strings 136 are formed. In some embodiments, staircase structure 146 at one side of memory stack 134 tilts toward the center of memory stack 134 that is disposed below substrate 132 to fan-out the word lines in the vertical direction toward substrate 108. In some embodiments, each word line contact 148 is disposed below substrate 132 and has an upper end in contact with memory stack 134 at staircase structure 146 to individually address a corresponding word line of the memory array device. It is understood that the details of counterparts of memory array devices (e.g., structures, materials, fabrication process, functions, etc.) in both peripheral device chip 102 and first memory array device chip 104 will be readily appreciated and will not be repeated.

First memory array device chip 104 can include an interconnect layer 150 (referred to herein as an "array interconnect layer") below memory stack 134 and NAND memory strings 136 therethrough to transfer electrical signals to and from the memory array devices on the lower side of substrate 132. Array interconnect layer 150 can include a plurality of interconnects formed in one or more ILD layers. In some embodiments, array interconnect layer 150 further includes, in its bottom portion, a plurality of bonding contacts 152 and bonding dielectrics electrically isolating bonding contacts 152. Bonding contacts 152 and bonding dielectrics of array interconnect layer 150 can be used for hybrid bonding as described below in detail. It is understood that the details of counterparts of interconnect layers (e.g., structures, materials, fabrication process, functions, etc.) in both peripheral device chip 102 and first memory array device chip 104 will be readily appreciated and will not be repeated.

As shown in FIG. 1, 3D memory device 100 can include a bonding interface 154 formed vertically between array interconnect layer 150 and peripheral interconnect layer 112. Peripheral device chip 102 and first memory array device chip 104 can be bonded at bonding interface 154. In some embodiments, peripheral device chip 102 and first memory array device chip 104 can be bonded using hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. Bonding contacts 114 in the top portion of peripheral interconnect layer 112 can form metal-metal bonding with bonding contacts 152 in the bottom portion of array interconnect layer 150; the bonding dielectrics in the top portion of peripheral interconnect layer 112 can form dielectric-dielectric bonding with the bonding dielectrics in the bottom portion of array interconnect layer 150.

As shown in FIG. 1, first memory array device chip 104 can also include another memory stack 156 disposed on the upper side of substrate 132, i.e., above substrate 132. Similar to the counterparts of peripheral device chip 102, first memory array device chip 104, on its upper side of substrate 132, can further include an array of NAND memory strings 158, a GLS 160, a dielectric structure 162 of memory stack 156 enclosed by a barrier structure 164, a staircase structure 166 of memory stack 156, and word line contacts 168.

In some embodiments, each NAND memory string 158 extends vertically through memory stack 156 and is disposed above substrate 132. Each NAND memory string 158 can include a source select gate at its lower end and a drain select gate at its upper end. In some embodiments, GLS 160 extends vertically through memory stack 156 and is disposed above substrate 132. GLS 160 can separate the NAND memory string array into different regions (e.g., memory fingers and/or memory blocks) and/or electrically control an ACS. In some embodiments, dielectric structure 162 is disposed above substrate 132 and laterally separates memory stack 156 into dielectric layer pairs (dielectric structure 162) and conductor/dielectric layer pairs through which NAND memory strings 158 are formed. In some embodiments, staircase structure 166 at one side of memory stack 156 tilts toward the center of memory stack 156 that is disposed above substrate 132 to fan-out the word lines in the vertical direction away from substrate 108. In some embodiments, each word line contact 168 is disposed above substrate 132 and has a lower end in contact with memory stack 156 at staircase structure 166 to individually address a corresponding word line of the memory array device. It is understood that the details of counterparts of memory array devices (e.g., structures, materials, fabrication process, functions, etc.) in both peripheral device chip 102 and first memory array device chip 104 will be readily appreciated and will not be repeated.

First memory array device chip 104 can include another interconnect layer 170 (referred to herein as an "array interconnect layer") above memory stack 156 and NAND memory strings 158 therethrough to transfer electrical signals to and from the memory array devices on the upper side of substrate 132. That is, first memory array device chip 104 includes two array interconnect layers 150 and 170 disposed on opposite sides of substrate 132, according to some embodiments. Array interconnect layer 170 can include a plurality of interconnects formed in one or more ILD layers. In some embodiments, array interconnect layer 170 further includes, in its top portion, a plurality of bonding contacts 172 and bonding dielectrics electrically isolating bonding contacts 172. Bonding contacts 172 and bonding dielectrics of array interconnect layer 170 can be used for hybrid bonding as described below in detail. It is understood that the details of counterparts of interconnect layers (e.g., structures, materials, fabrication process, functions, etc.) in both peripheral device chip 102 and first memory array device chip 104 will be readily appreciated and will not be repeated.

As shown in FIG. 1, first memory array device chip 104 can further include a TAC 140 extending vertically through substrate 132 and both memory stacks 134 and 156 on opposite sides of substrate 132. TAC 140 extends vertically through the entire thickness of dielectric structure 142 of memory stack 134, the entire thickness of dielectric structure 162 of memory stack 156, and the entire thickness of substrate 132, according to some embodiments. TAC 140 can carry electrical signals from and/or to the memory array devices on first memory array device chip 104 (e.g., NAND memory strings 136 and 158), such as part of the power bus, with shortened interconnect routing. In some embodiments, TAC 140 can provide electrical connections between the memory array devices (e.g., NAND memory strings 136 and 158) on opposite sides of substrate 132 and/or between first memory array device chip 104 and each of peripheral device chip 102 and second memory array device chip 106. TAC 140 can also provide mechanical support to memory stacks 134 and 156.

In some embodiments, TAC 122 of peripheral device chip 102 and TAC 140 of first memory array device chip 104 are electrically connected by contacts in peripheral interconnect layer 112 and array interconnect layer 150 (e.g., bonding contacts 114 and 152 as shown in FIG. 1). That is, each of peripheral interconnect layer 112 and array interconnect layer 150 can include contacts electrically connecting TAC 122 of peripheral device chip 102 and TAC 140 of first memory array device chip 104. By electrically connecting TACs 122 and 140, electrical signals can be transferred between any suitable devices in peripheral device chip 102 and first memory array device chip 104.

As shown in FIG. 1, second memory array device chip 106 can be disposed above first memory array device chip 104. In some embodiments, second memory array device chip 106 is disposed below peripheral device chip 102. Second memory array device chip 106 can be a single-sided memory array device chip, a double-sided memory array device chip, or any memory array device chip that includes at least one memory stack. Different from peripheral device chip 102, second memory array device chip 106 includes only memory array devices, but not any peripheral device, according to some embodiments.

Second memory array device chip 106 can include a substrate 174, which can include silicon (e.g., single crystalline silicon), SiGe, GaAs, Ge, SOI, or any other suitable materials. Second memory array device chip 106 can also include a memory stack 176 disposed below substrate 174. Similar to the counterparts of peripheral device chip 102 and first memory array device chip 104, second memory array device chip 106 can further include an array of NAND memory strings 178, a GLS 180, a dielectric structure 184 of memory stack 176 enclosed by a barrier structure 186, a staircase structure 188 of memory stack 176, and word line contacts 190. It is understood that the details of counterparts of memory array devices (e.g., structures, materials, fabrication process, functions, etc.) in peripheral device chip 102, first memory array device chip 104, and second memory array device chip 106 will be readily appreciated and will not be repeated.

Second memory array device chip 106 can include an interconnect layer 192 (referred to herein as an "array interconnect layer") below memory stack 176 and NAND memory strings 178 therethrough to transfer electrical signals to and from the memory array devices of second memory array device chip 106. Array interconnect layer 192 can include a plurality of interconnects formed in one or more ILD layers. In some embodiments, array interconnect layer 192 further includes, in its bottom portion, a plurality of bonding contacts 194 and bonding dielectrics electrically isolating bonding contacts 194. Bonding contacts 194 and bonding dielectrics of array interconnect layer 192 can be used for hybrid bonding as described below in detail. It is understood that the details of counterparts of interconnect layers (e.g., structures, materials, fabrication process, functions, etc.) in peripheral device chip 102, first memory array device chip 104, and second memory array device chip 106 will be readily appreciated and will not be repeated.

As shown in FIG. 1, second memory array device chip 106 can further include a TAC 182 extending vertically through dielectric structure 184 of memory stack 176. TAC 182 can be formed only inside dielectric structure 184 enclosed laterally by at least barrier structure 186. TAC 182 can extend through the entire thickness of memory stack 176, (e.g., all the dielectric layer pairs in the vertical direction). In some embodiments, TAC 182 further extends through at least part of substrate 174. TAC 182 can carry electrical signals from and/or to second memory array device chip 106, such as part of the power bus, with shortened interconnect routing. In some embodiments, TAC 182 can provide electrical connections between peripheral device chip 102 and each of memory array device chips 104 and 106. TAC 182 can also provide mechanical support to memory stack 116.

In some embodiments, TAC 182 of second memory array device chip 106 and TAC 140 of first memory array device chip 104 are electrically connected by contacts in array interconnect layer 192 and array interconnect layer 170 (e.g., bonding contacts 194 and 172 as shown in FIG. 1). That is, each of array interconnect layer 192 and array interconnect layer 170 can include contacts electrically connecting TAC 182 of second memory array device chip 106 and TAC 140 of first memory array device chip 104. By electrically connecting TACs 182, 140, and 122, electrical signals can be transferred between any suitable devices in peripheral device chip 102 and each of two memory array device chips 104 and 106 of 3D memory device 100.

As shown in FIG. 1, 3D memory device 100 can include another bonding interface 196 formed vertically between array interconnect layer 192 and array interconnect layer 170. First memory array device chip 104 and second memory array device chip 106 can be bonded at bonding interface 196. In some embodiments, first memory array device chip 104 and second memory array device chip 106 can be bonded using hybrid bonding. Bonding contacts 172 in the top portion of array interconnect layer 170 can form metal-metal bonding with bonding contacts 194 in the bottom portion of array interconnect layer 192; the bonding dielectrics in the top portion of array interconnect layer 170 can form dielectric-dielectric bonding with the bonding dielectrics in the bottom portion of array interconnect layer 192. That is, first memory array device chip 104 can be bonded with both peripheral device chip 102 and second memory array device chip 106 on opposite sides using, for example, hybrid bonding, to form 3D memory device 100.

3D memory device 100 can be referred to herein as a multi-stack 3D memory device, which include a plurality of memory stacks (and NAND memory string arrays therethrough) on multiple device chips stacked vertically by bonding techniques. In some embodiments, to facilitate the addressing of NAND memory string arrays in different memory stacks, 3D memory device 100 includes select lines 198A and 198B to select between NAND memory strings 118, 136, 158, and 178 on different device chips 102, 104, and 106. In one example, select line 198A can be configured to select between NAND memory strings 118 of peripheral device chip 102 and NAND memory strings 136 on the lower side of first memory array device chip 104. In another example, select line 198B can be configured to select between NAND memory strings 158 on the upper side of first memory array device chip 104 and NAND memory strings 178 of second memory array device chip 106.

Figure 2A:
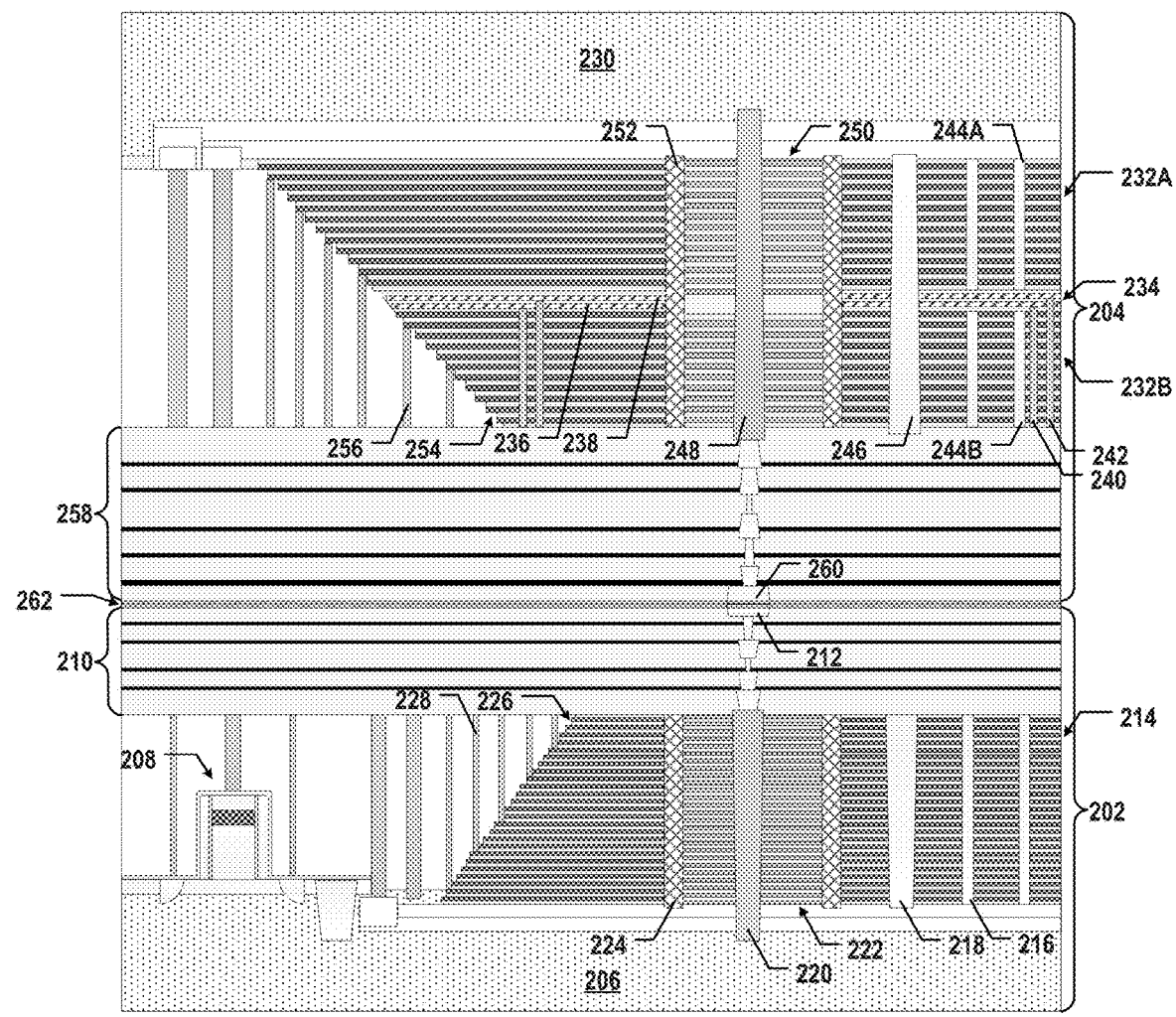
FIG. 2A illustrates a cross-section of another exemplary 3D memory device having multiple memory stacks, according to some embodiments of the present disclosure.

FIG. 2A illustrates a cross-section of another exemplary 3D memory device 200 having multiple memory stacks, according to some embodiments of the present disclosure. As shown in FIG. 2A, 3D memory device 200 can be a two-chip memory device including a peripheral device chip 202 and a memory array device chip 204 stacked vertically as well as electrically and mechanically connected using bonding techniques, such as hybrid bonding. It is understood that bonding techniques can provide flexibility of connecting any number of device chips in any vertical arrangement to increase the cell density and production yield of 3D memory device 200. It is understood that 3D memory device 200 can have two or more memory array device chips to further increase the cell density, and the peripheral device chip and memory array device chip(s) can be stacked in any order. For example, peripheral device chip 202 can be disposed at the bottom, at the top, or in the middle of 3D memory device 200. Memory array device chip 204 is a multi-deck memory array device chip that has multiple memory decks in a memory stack, which can enable the continuous scale-up of the level of memory stack on the same side of the chip substrate. It is understood that memory array device chip 204 is not limited to a multi-deck memory array device chip and can be any memory array device chip that includes at least one memory stack.

Similar to the counterparts of peripheral device chip 102 in 3D memory device 100 shown in FIG. 1, peripheral device chip 202 of 3D memory device 200 can include a substrate 206, a peripheral device, e.g., transistors 208, on substrate 206, and a peripheral interconnect layer 210 above the peripheral device, which includes a plurality of bonding contacts 260 and bonding dielectrics in its top portion. Additionally or optionally, peripheral device chip 202 can include memory array devices beside the peripheral device as shown in FIG. 2A, or memory array devices above or below the peripheral device. In some embodiments, the memory array devices of peripheral device chip 202 include a memory stack 214 having a dielectric structure 222 and a staircase structure 226, an array of NAND memory strings 216, a GLS 218, a TAC 220, a barrier structure 224, and local contacts such as word line contacts 228. It is understood that the details of counterparts of peripheral devices and memory array devices (e.g., structures, materials, fabrication process, functions, etc.) in both peripheral device chip 102 in FIG. 1 and peripheral device chip 202 in FIG. 2A will be readily appreciated and will not be repeated.

Memory array device chip 204 can include a substrate 230, which can include silicon (e.g., single crystalline silicon), SiGe, GaAs, Ge, SOI, or any other suitable materials. Memory array device chip 204 can also include a memory stack 232 disposed below substrate 230. As shown in FIG. 2A, memory stack 232 can include a first memory deck 232A and a second memory deck 232B disposed one over another as well as a common source layer 234 disposed vertically between first and second memory decks 232A and 232B. In some embodiments, first and second memory decks 232A and 232B each includes a plurality of conductor/dielectric layer pairs and are separated by common source layer 234. Common source layer 234 can include a first conductive layer 236 and a second conductive layer 238 that are electrically isolated by one or more ILD layers. Conductive layers 236 and 238 can include conductive materials including, but not limited to, W, Co, Cu, Al, doped silicon, silicides, or any combination thereof. In some embodiments, conductive layers 236 and 238 include polysilicon doped with p-type dopants and n-type dopants, respectively.

Memory array device chip 204 can include a first array of NAND memory strings 244A each extending vertically through first memory deck 232A, and a second array of NAND memory strings 244B each extending vertically through second memory deck 232B. In some embodiments, each NAND memory string 244A or 244B is electrically connected to common source layer 234. In some embodiments, memory array device chip 204 further includes a GLS 246 and a barrier structure 252 each extending vertically through memory stack 232, e.g., memory decks 232A and 232B and common source layer 234. Barrier structure 252 can laterally separate memory stack 232 into a dielectric structure 250 including a plurality of dielectric layer pairs and a plurality of conductor/dielectric layer pairs through which NAND memory strings 244A and 244B extend. In some embodiments, memory array device chip 204 also includes a TAC 248 extending vertically through dielectric structure 250 of memory stack 232, such as the entire thickness of memory decks 232A and 232B and common source layer 234. In some embodiments, TAC 248 further extends into at least part of substrate 230.

Memory array device chip 204 can further include local contacts to fan-out the memory array devices. In some embodiments, the local contacts include word line contacts 256 each in contact with a corresponding conductor layer of first memory deck 232A or second memory deck 232B at a staircase structure 254 of memory stack 232. As shown in FIG. 2A, the local contacts can also include a first source contact 240 electrically connected to first conductive layer 236 in common source layer 234 and a second source contact 242 electrically connected to second conductive layer 238 in common source layer 234. That is, two conductive layers 236 and 238 in common source layer 234 can be individually selected by corresponding first or second source contact 240 or 242. It is understood that the details of counterparts of memory array devices (e.g., structures, materials, fabrication process, functions, etc.) in 3D memory device 100 in FIG. 1 and 3D memory device 200 in FIG. 2A will be readily appreciated and will not be repeated.

Memory array device chip 204 can also include an array interconnect layer 258 below memory stack 232 and NAND memory strings 244A and 244B therethrough. Array interconnect layer 258 can include a plurality of interconnects formed in one or more ILD layers. In some embodiments, array interconnect layer 258 further includes, in its bottom portion, a plurality of bonding contacts 260 and bonding dielectrics electrically isolating bonding contacts 260. Bonding contacts 260 and bonding dielectrics of array interconnect layer 258 can be used for hybrid bonding as described below in detail. In some embodiments, TAC 248 of memory array device chip 204 and TAC 220 of peripheral device chip 202 are electrically connected by contacts in array interconnect layer 258 and peripheral interconnect layer 210 (e.g., bonding contacts 260 and 212 as shown in FIG. 2A). That is, each of peripheral interconnect layer 210 and array interconnect layer 258 can include contacts electrically connecting TAC 220 of peripheral device chip 202 and TAC 248 of memory array device chip 204. By electrically connecting TACs 248 and 220, electrical signals can be transferred between any suitable devices on peripheral device chip 202 and memory array device chip 204 of 3D memory device 200. It is understood that the details of counterparts of interconnect layers (e.g., structures, materials, fabrication process, functions, etc.) in 3D memory device 100 in FIG. 1 and 3D memory device 200 in FIG. 2A will be readily appreciated and will not be repeated.

As shown in FIG. 2A, 3D memory device 200 can include a bonding interface 262 formed vertically between array interconnect layer 258 and peripheral interconnect layer 210. Peripheral device chip 202 and memory array device chip 204 can be bonded at bonding interface 262. In some embodiments, peripheral device chip 202 and memory array device chip 204 can be bonded using hybrid bonding. Bonding contacts 212 in the top portion of peripheral interconnect layer 210 can form metal-metal bonding with bonding contacts 260 in the bottom portion of array interconnect layer 258; the bonding dielectrics in the top portion of peripheral interconnect layer 210 can form dielectric-dielectric bonding with the bonding dielectrics in the bottom portion of array interconnect layer 258. It is understood that memory array device chip 204 can be bonded with peripheral device chip 202 in either order using, for example, hybrid bonding, to form 3D memory device 200.

Figure 2B:
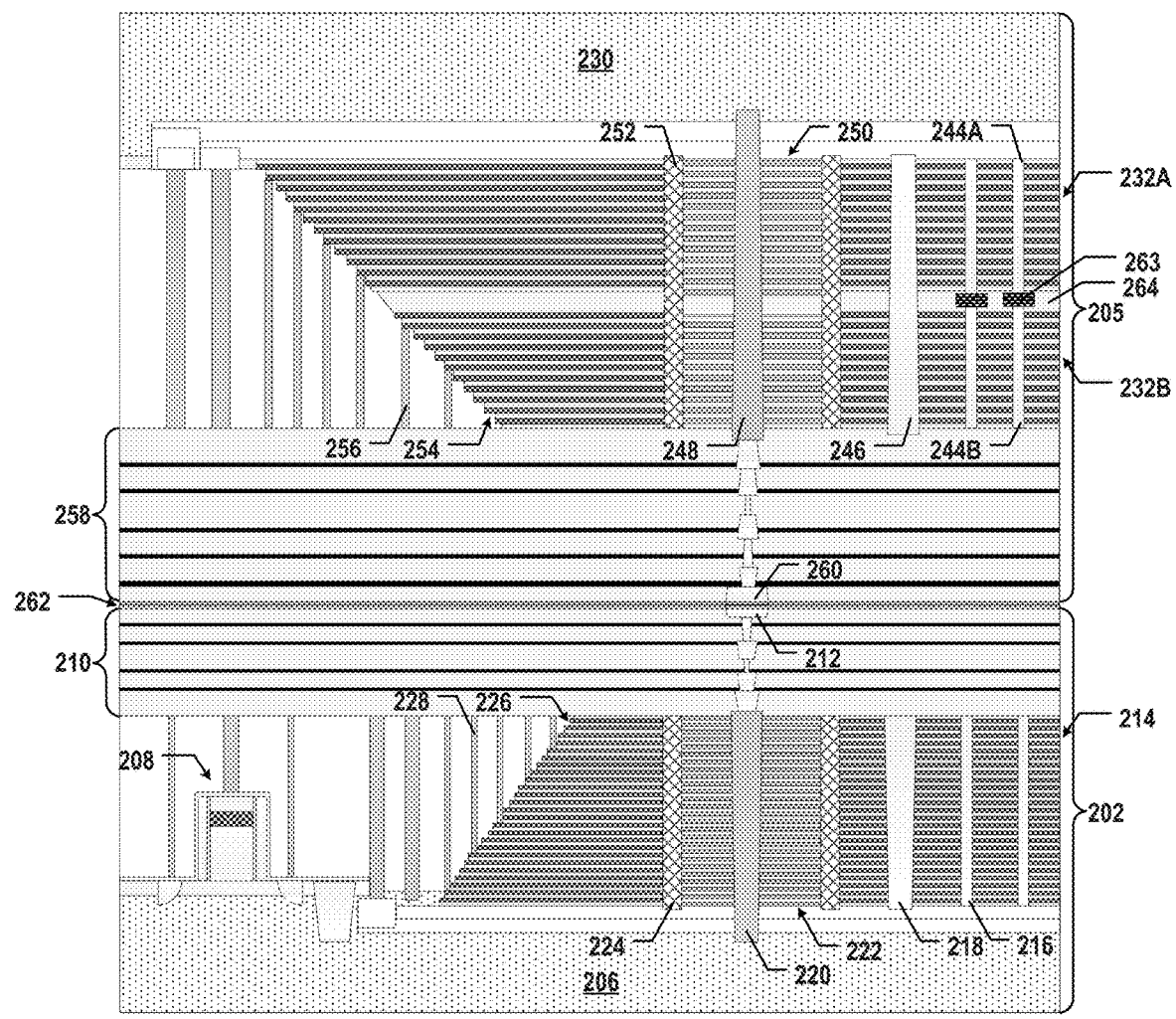
FIG. 2B illustrates a cross-section of still another exemplary 3D memory device having multiple memory stacks, according to some embodiments of the present disclosure.

FIG. 2B illustrates a cross-section of still another exemplary 3D memory device 201 having multiple memory stacks, according to some embodiments of the present disclosure. 3D memory device 201 is substantially similar to 3D memory device 200 in FIG. 2A except that 3D memory device 201 uses inter-deck plugs (IDPs) 263 to replace common source layer 234 used by 3D memory device 200 for electrically connecting NAND memory strings 244A and 244B in different memory decks 232A and 232B. As shown in FIG. 2B, memory array device chip 205 of 3D memory device 201 includes a dielectric layer 264 disposed vertically between first memory deck 232A and second memory deck 232B. IDPs 263 can be formed in dielectric layer 264 and electrically connected to NAND memory strings 244A and 244B. In some embodiments, IDPs 263 include semiconductor plugs, such as undoped polysilicon. It is understood that any combinations of double-sided memory array device chips (e.g., 104), single-sided memory array device chips (e.g., 106), common source layer multi-deck memory array device chips (e.g., 204) and IDPs multi-deck memory array device chips (e.g., 205) can be present in 3D memory devices using hybrid bonding. It is further understood that the pad-out of the 3D memory devices (e.g., 100, 200, and 201) can be from either the peripheral device chip or the memory array device chip.

Figure 3A:
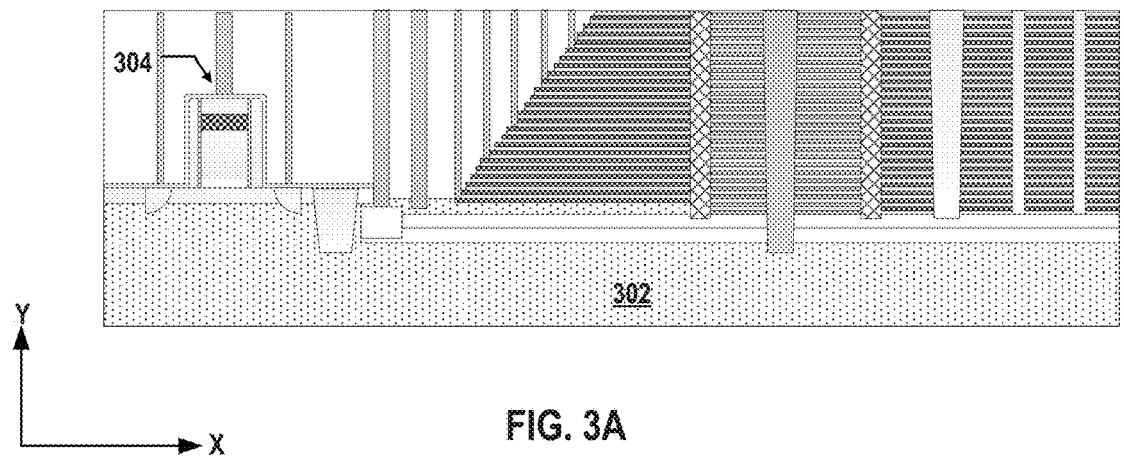
FIGS. 3A-3B illustrate a fabrication process for forming an exemplary peripheral device chip, according to some embodiments of the present disclosure.
Figure 3B:
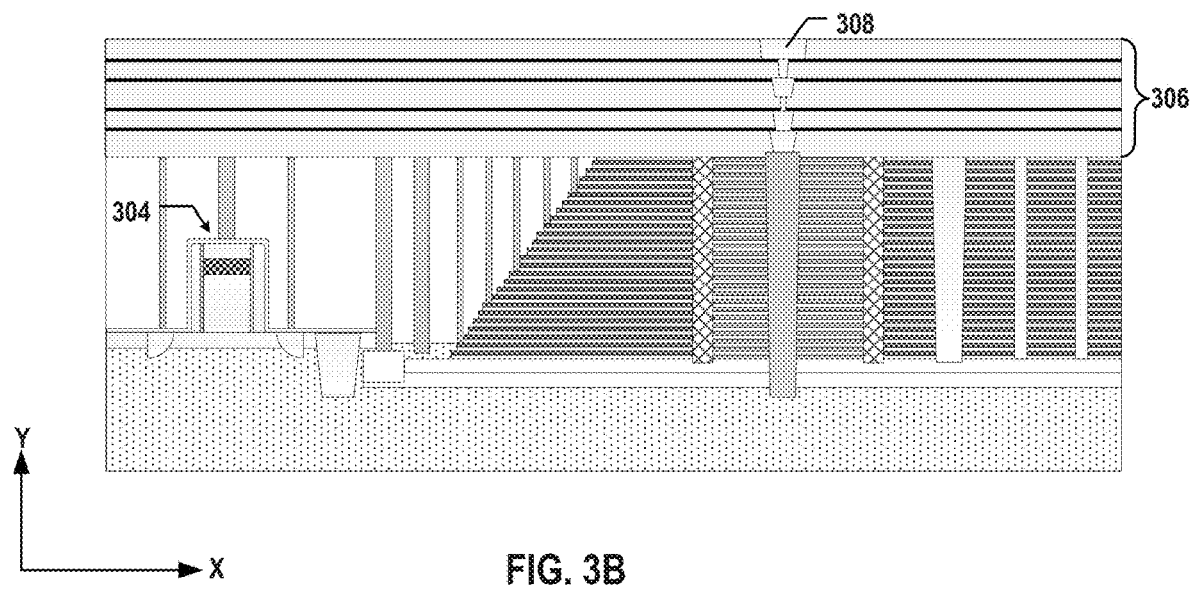
Figure 6:
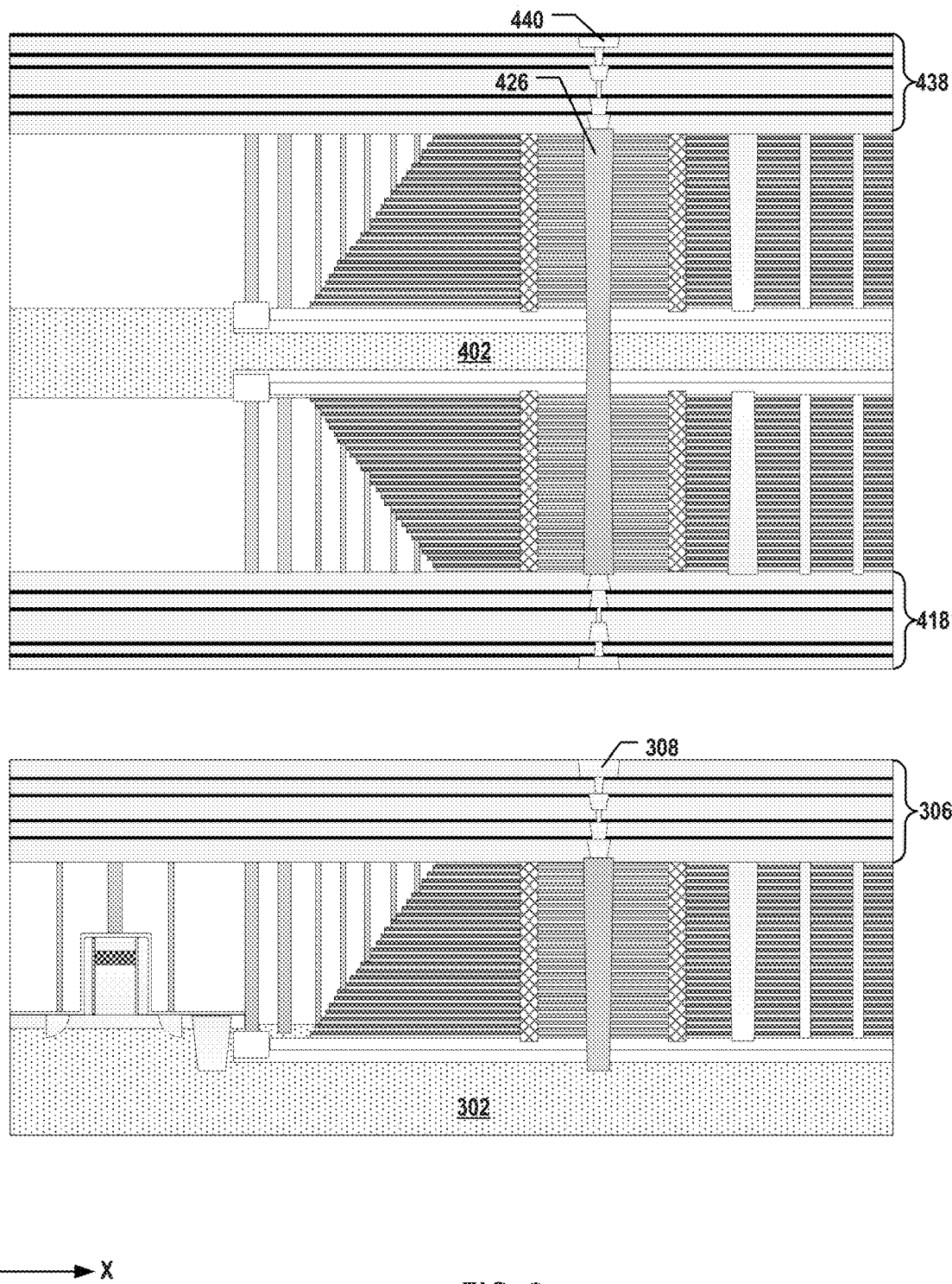
FIG. 6 illustrates a fabrication process for bonding an exemplary double-sided memory array device chip and an exemplary peripheral device chip, according to some embodiments of the present disclosure.
Figure 8:
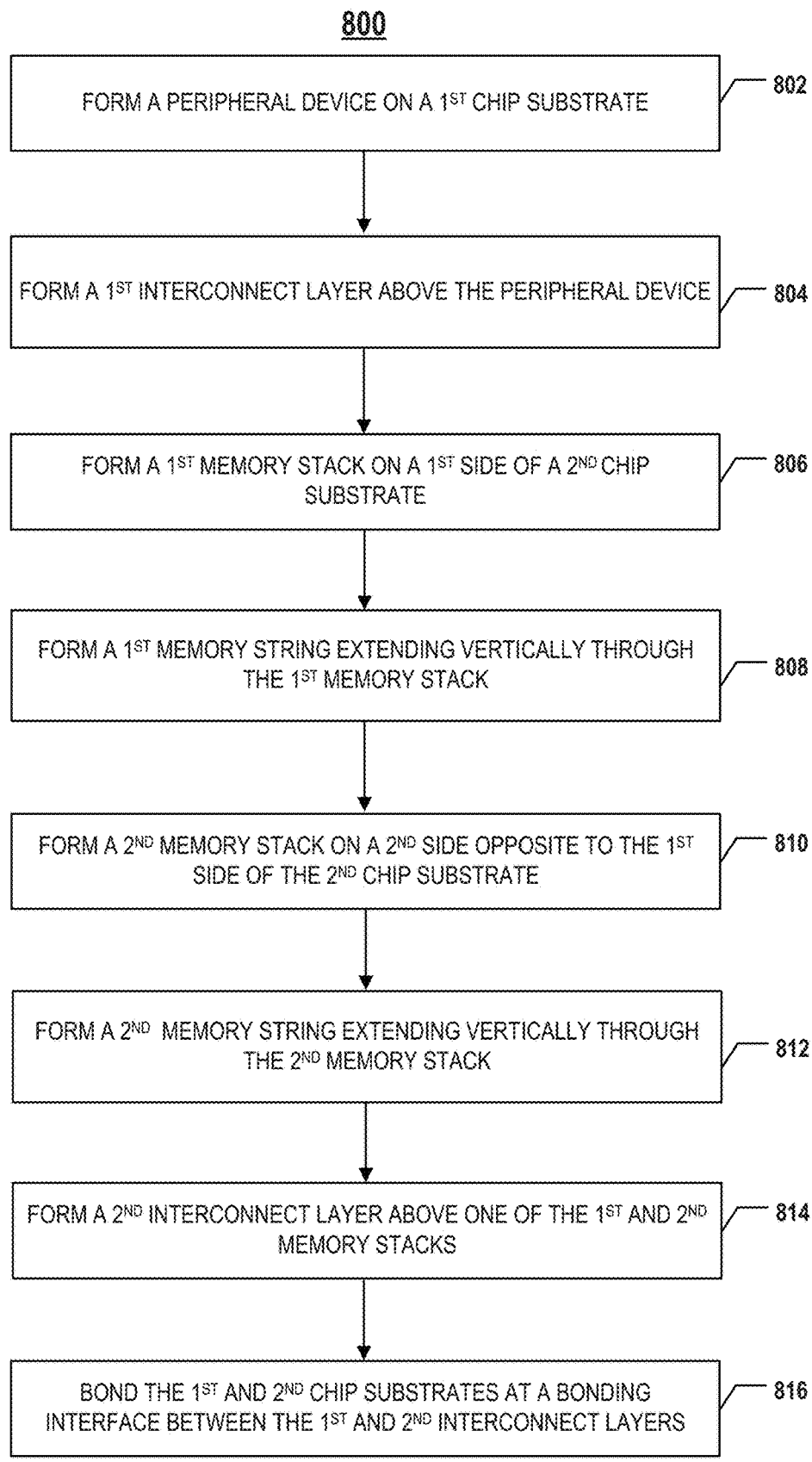
FIG. 8 is a flowchart of an exemplary method for forming a 3D memory device having multiple memory stacks, according to some embodiments.

FIGS. 3A-3B illustrate a fabrication process for forming an exemplary peripheral device chip, according to some embodiments. FIGS. 4A-4D illustrate a fabrication process for forming an exemplary double-sided memory array device chip, according to some embodiments. FIG. 6 illustrates a fabrication process for bonding an exemplary double-sided memory array device chip and an exemplary peripheral device chip, according to some embodiments. FIG. 8 is a flowchart of an exemplary method for forming a 3D memory device having multiple memory stacks, according to some embodiments. Examples of the 3D memory device depicted in FIGS. 3A-3B, 4A-4D, 6, and 8 include 3D memory device 100 depicted in FIG. 1. FIGS. 3A-3B, 4A-4D, 6, and 8 will be described together. It is understood that the operations shown in method 800 are not exhaustive and that other operations can be performed as well before, after, or between any of the illustrated operations. Further, some of the operations may be performed simultaneously, or in a different order than shown in FIG. 8.

Referring to FIG. 8, method 800 starts at operation 802, in which a peripheral device is formed on a first chip substrate. The substrate can be a silicon substrate. As illustrated in FIG. 3A, a peripheral device is formed on a silicon substrate 302. The peripheral device can include a plurality of transistors 304 formed on silicon substrate 302. Transistors 304 can be formed by a plurality of processes including, but not limited to, photolithography, etching, thin film deposition, thermal growth, implantation, chemical mechanical polishing (CMP), and any other suitable processes. In some embodiments, doped regions are formed in silicon substrate 302 by ion implantation and/or thermal diffusion, which function, for example, as source regions and/or drain regions of transistors 304. In some embodiments, isolation regions (e.g., STIs) are also formed in silicon substrate 302 by etching and thin film deposition. It is understood that memory array devices can be formed beside, above, or below the peripheral device (e.g., transistors 304), and the fabrication processes for forming the memory array devices will be described below with respect to the counterparts of memory array device chips.

Method 800 proceeds to operation 804, as illustrated in FIG. 8, in which a first interconnect layer (e.g., a peripheral interconnect layer) is formed above the peripheral device. The peripheral interconnect layer can include a plurality of interconnects in one or more ILD layers. As illustrated in FIG. 3B, a peripheral interconnect layer 306 can be formed above transistors 304. Peripheral interconnect layer 306 can include interconnects, including interconnect lines and via contacts of MEOL and/or BEOL in a plurality of ILD layers, to make electrical connections with the peripheral device (e.g., transistors 304). In some embodiments, peripheral interconnect layer 306 includes bonding contacts 308 and bonding dielectrics in its top portion.

In some embodiments, peripheral interconnect layer 306 includes multiple ILD layers and interconnects therein formed in multiple processes. For example, interconnects can include conductive materials deposited by one or more thin film deposition processes including, but not limited to, chemical vapor deposition (CVD), physical vapor deposition (PVD), atomic layer deposition (ALD), electroplating, electroless plating, or any combination thereof. Fabrication processes to form the interconnects can also include photolithography, CMP, etching, or any other suitable processes. The ILD layers can include dielectric materials deposited by one or more thin film deposition processes including, but not limited to, CVD, PVD, ALD, or any combination thereof. The ILD layers and interconnects illustrated in FIG. 3B can be collectively referred to as an "interconnect layer" (e.g., peripheral interconnect layer 306).

Figure 4A:
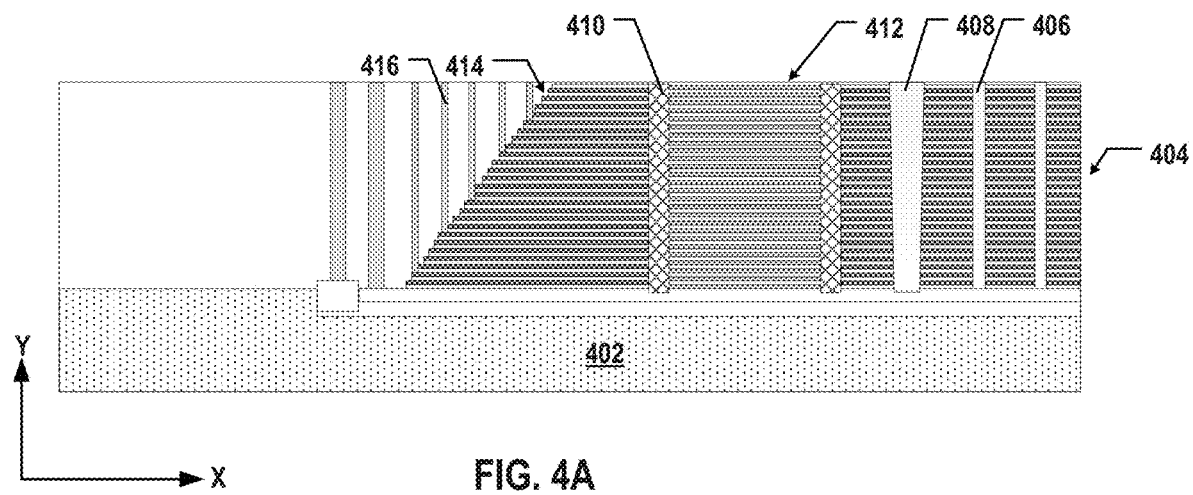
FIGS. 4A-4D illustrate a fabrication process for forming an exemplary double-sided memory array device chip, according to some embodiments of the present disclosure.

Method 800 proceeds to operation 806, as illustrated in FIG. 8, in which a first memory stack is formed on a first side of a second chip substrate. As illustrated in FIG. 4A, a memory stack 404 including a plurality of conductor/dielectric pairs is formed on a silicon substrate 402. The fabrication processes of forming memory stack 404 can include first forming a plurality of dielectric layer pairs by one or more thin film deposition processes including, but not limited to, CVD, PVD, ALD, or any combination thereof. The fabrication processes of forming memory stack 404 can also include a gate replacement process, i.e., replacing the sacrificial layers (e.g., silicon nitride layers) in the dielectric layer pairs with a plurality of conductor layers (e.g., tungsten layers) in the conductor/dielectric layer pairs using wet etching and/or dry etching processes, followed by one or more thin film deposition processes.

As illustrated in FIG. 4A, a GLS 408 that extends vertically through memory stack 404 can be formed above silicon substrate 402. GLS 408 can include dielectric materials including, but not limited to, silicon oxide, silicon nitride, silicon oxynitride, or any combination thereof. GLS 408 can be formed by dry etching and/or wet etching processes to form a vertical opening through the dielectric layer pairs, followed by a filling process to fill the opening with dielectric materials. The opening can be filled by CVD, PVD, ALD, any other suitable processes, or any combination thereof. In some embodiments, prior to the filling process, GLS 408 can be used as the passageway for gate replacement process in forming memory stack 404.

As illustrated in FIG. 4A, a barrier structure 410 that extends vertically through memory stack 404 is formed above silicon substrate 402 prior to the gate replacement process. As a result, the region enclosed by barrier structure 410 will not be subject to the gate replacement process, and the dielectric layer pairs will remain in the region after the gate replacement process to form a dielectric structure 412 of memory stack 404. Barrier structure 410 can be patterned by photolithography, CMP and/or etching, and filled with dielectric materials using thin film deposition processes, such as CVD, PVD, ALD, or any combination thereof.

As illustrated in FIG. 4A, a staircase structure 414 is formed at the lateral side of memory stack 404. Staircase structure 414 can be formed by a trim-etch process. Word line contacts 416 can be formed above silicon substrate 402 at staircase structure 414. Each word line contact 416 can extend vertically through a dielectric layer. In some embodiments, fabrication processes to form word line contacts 416 include forming vertical openings using an etching process, followed by filling the openings with conductive materials using ALD, CVD, PVD, electroplating, any other suitable processes, or any combination thereof.

Method 800 proceeds to operation 808, as illustrated in FIG. 8, in which a first memory string extending vertically through the first memory stack is formed. As illustrated in FIG. 4A, NAND memory strings 406 are formed on silicon substrate 402. NAND memory strings 406 can each extend vertically through memory stack 404. In some embodiments, the conductor layers in memory stack 404 are used to form the select gates and word lines of NAND memory strings 406. At least some of the conductor layers in memory stack 404 (e.g., except the top and bottom conductor layers) can each be used as the word lines of NAND memory strings 406.

In some embodiments, fabrication processes for forming NAND memory string 406 include forming a semiconductor channel that extends vertically through memory stack 404. In some embodiments, fabrication processes for forming NAND memory string 406 further include forming a composite dielectric layer (memory film) between the semiconductor channel and the conductor/dielectric layer pairs in memory stack 404. The composite dielectric layer can include, but not limited to, a tunneling layer, a storage layer, and a blocking layer. The semiconductor channel and composite dielectric layer can be formed by thin film deposition processes such as ALD, CVD, PVD, any other suitable processes, or any combination thereof.

Method 800 proceeds to operation 810, as illustrated in FIG. 8, in which a second memory stack is formed on a second side opposite to the first side of the second chip substrate. Method 800 proceeds to operation 812, as illustrated in FIG. 8, in which a second memory string extending vertically through the second memory stack is formed. In some embodiments, a contact extending vertically through the first and second memory stacks and the second chip substrate is formed.

Figure 4B:
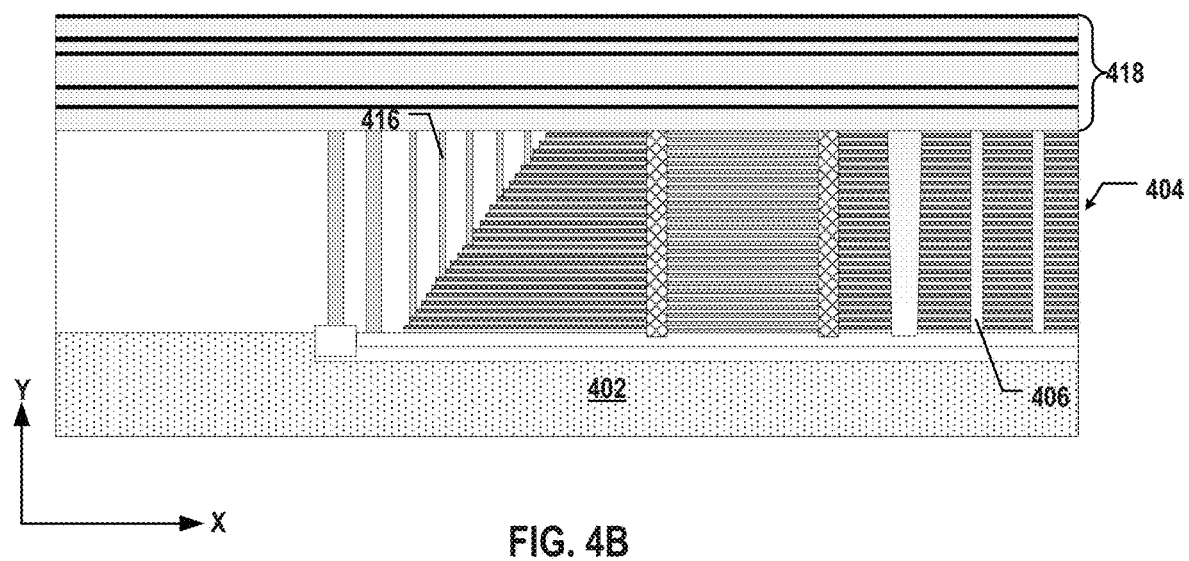
Figure 4C:
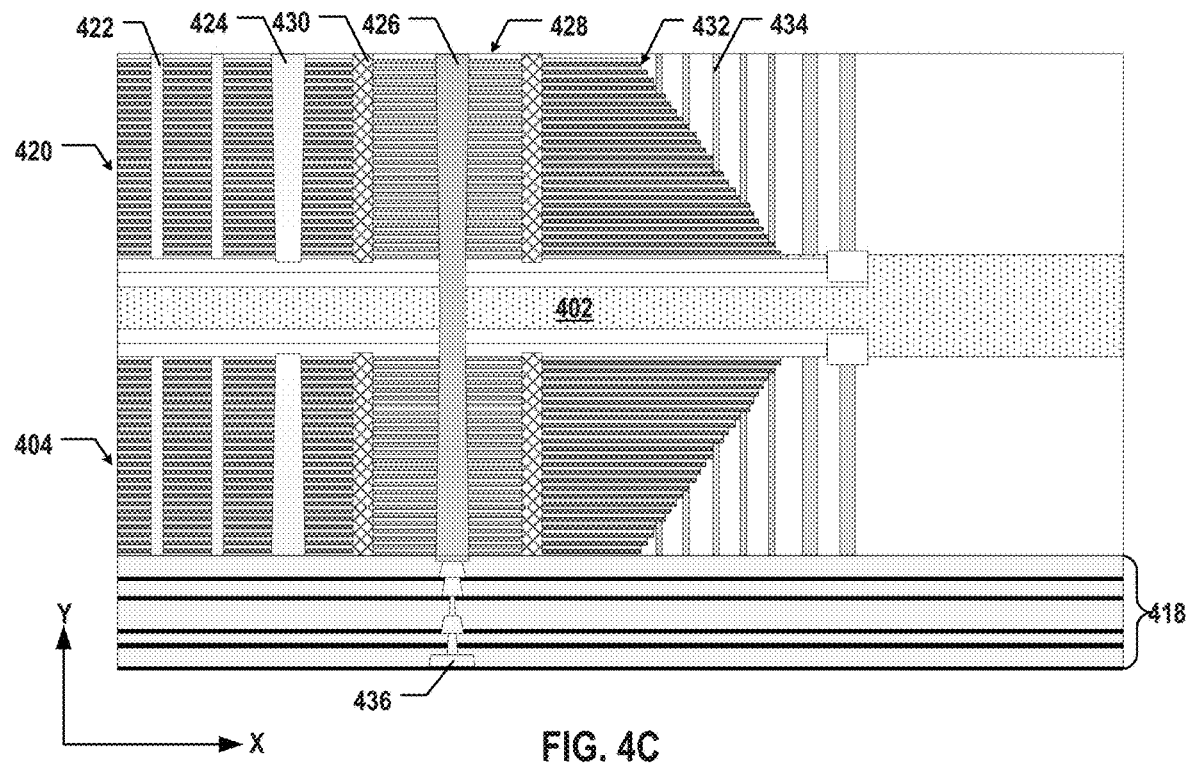

As illustrated in FIG. 4C, silicon substrate 402 can be flipped upside down to fabricate another memory stack 420 on the opposite side of silicon substrate 402 on which memory stack 404 is formed. Memory stack 420, NAND memory strings 422, a GLS 424, a barrier structure 430, a dielectric structure 428 and a staircase structure 432 of memory stack 420, and local contacts such as word line contacts 434 are formed using the same fabrication processes for forming the counterparts in FIG. 4A, according to some embodiments, and will not be repeated.

As illustrated in FIG. 4C, a TAC 426 extending vertically through memory stacks 404 and 420 and silicon substrate 402 can be formed. In some embodiments, fabrication processes for forming TAC 426 include forming a vertical opening by one or more wet etching and/or dry etching processes and filling the opening with conductive materials using thin film deposition processes, such as ALD, CVD, PVD, electroplating, any other suitable processes, or any combination thereof.

Method 800 proceeds to operation 814, as illustrated in FIG. 8, in which a second interconnect layer (e.g., an array interconnect layer) is formed above one of the first and second memory stacks. The array interconnect layer can include a plurality of interconnects in one or more ILD layers. As illustrated in FIG. 4B, an array interconnect layer 418 can be formed above memory stack 404 and NAND memory strings 406. As illustrated in FIG. 4C, bonding contacts 436 and bonding dielectrics can be formed in array interconnect layer 418. In some embodiments, the interconnects of array interconnect layer can include conductive materials deposited by one or more thin film deposition processes including, but not limited to, CVD, PVD, ALD, electroplating, electroless plating, or any combination thereof. The ILD layers can include dielectric materials deposited by one or more thin film deposition processes including, but not limited to, CVD, PVD, ALD, or any combination thereof.

Figure 4D:
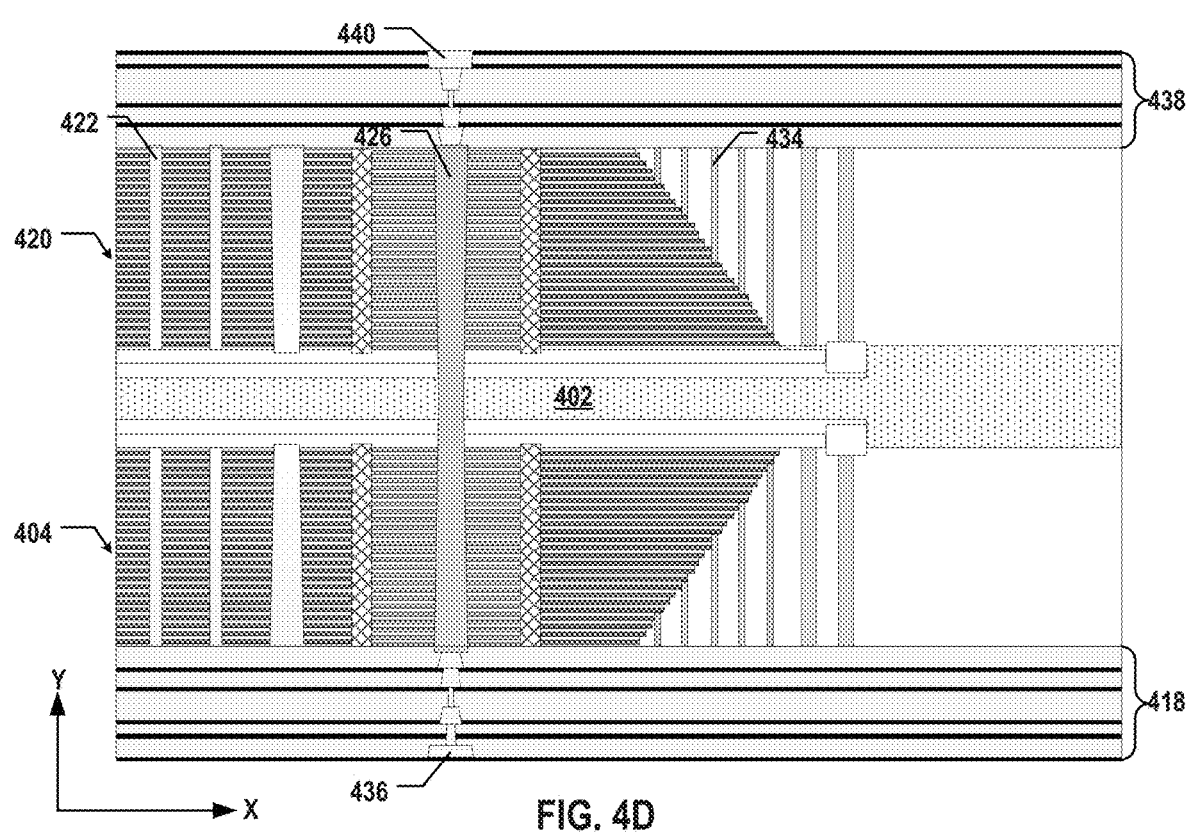

As illustrated in FIG. 4D, another array interconnect layer 438 can be formed on another side of silicon substrate 402 above memory stack 420 and NAND memory strings 422. Bonding contacts 440 and bonding dielectrics can be formed in array interconnect layer 438. Array interconnect layer 438 is formed using the same fabrication processes for forming array interconnect layer 418 in FIG. 4B, according to some embodiments, and will not be repeated.

Method 800 proceeds to operation 816, as illustrated in FIG. 8, in which the first chip substrate and second chip substrate are bonded at a bonding interface between the first interconnect layer and the second interconnect layer. The bonding can be hybrid bonding. As illustrated in FIG. 6, array interconnect layer 418 (or array interconnect layer 438) can be bonded with peripheral interconnect layer 306, thereby forming a bonding interface. In some embodiments, a treatment process, e.g., a plasma treatment, a wet treatment, and/or a thermal treatment, is applied to the bonding surfaces prior to the bonding. After the bonding, bonding contacts 308 in peripheral interconnect layer 306 and bonding contacts 436 in array interconnect layer 418 (or bonding contacts 440 in array interconnect layer 438) are aligned and in contact with one another, so that the interconnects in array interconnect layer 418 (or array interconnect layer 438) are electrically connected to the interconnects in peripheral interconnect layer 306. In the bonded device, silicon substrate 402 can be either above or below silicon substrate 302.

Figure 7:
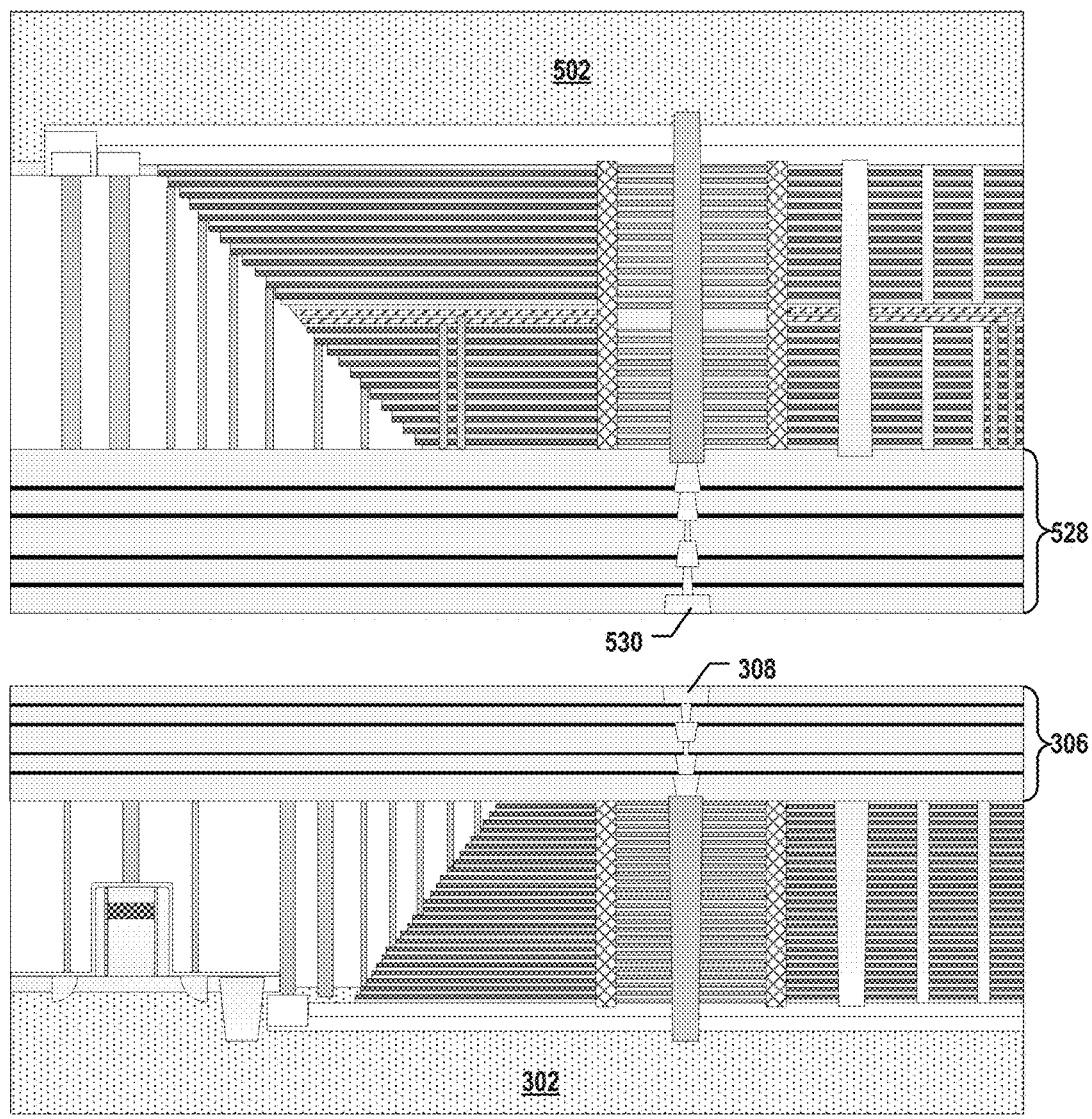
FIG. 7 illustrates a fabrication process for bonding an exemplary multi-deck memory array device chip and an exemplary peripheral device chip, according to some embodiments of the present disclosure.
Figure 9:
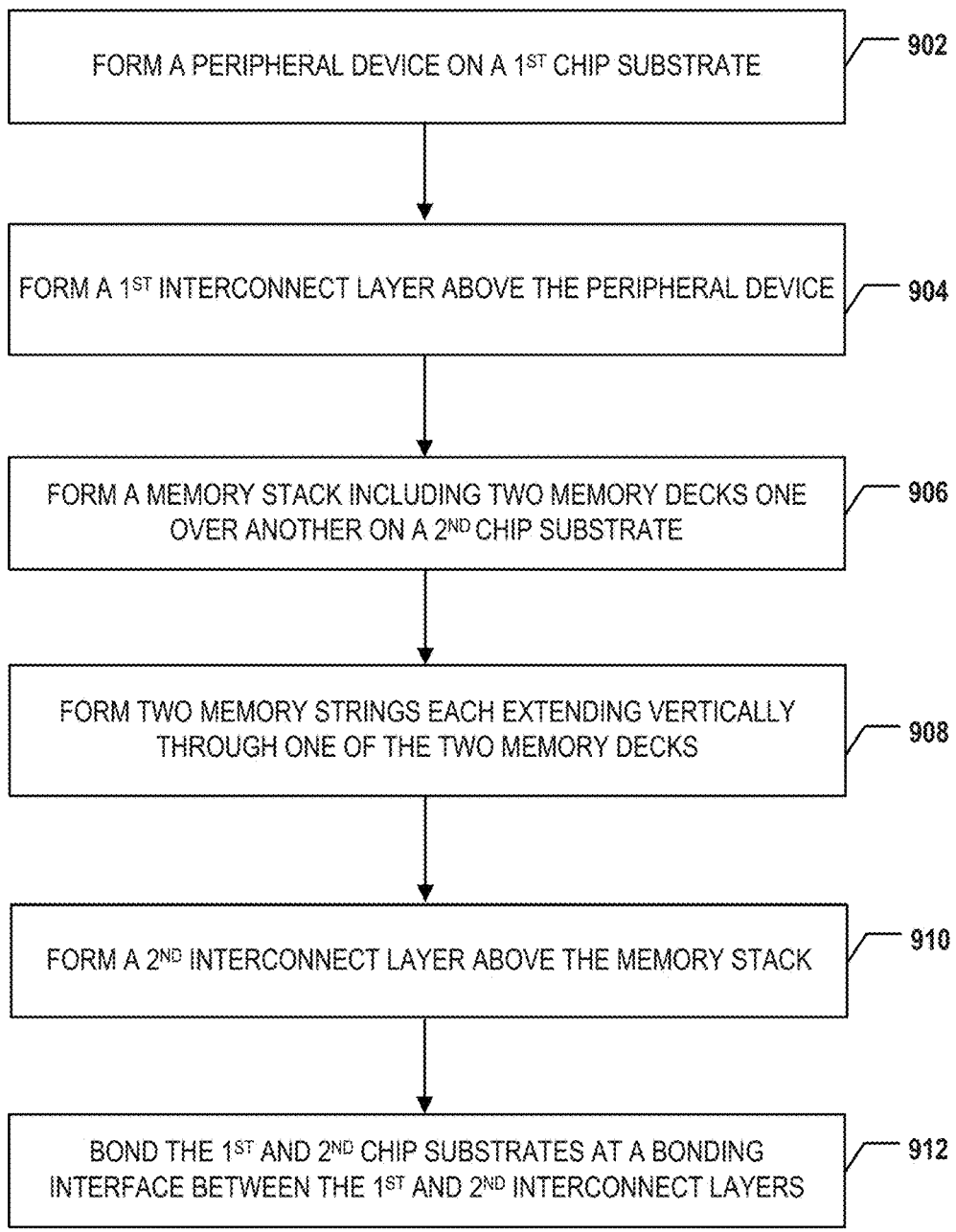
FIG. 9 is a flowchart of another exemplary method for forming a 3D memory device having multiple memory stacks, according to some embodiments.

FIGS. 5A-5G illustrate a fabrication process for forming an exemplary multi-deck memory array device chip, according to some embodiments. FIG. 7 illustrates a fabrication process for bonding an exemplary multi-deck memory array device chip and an exemplary peripheral device chip, according to some embodiments. FIG. 9 is a flowchart of another exemplary method for forming a 3D memory device having multiple memory stacks, according to some embodiments. Examples of the 3D memory device depicted in FIGS. 5A-5G, 7, and 9 include 3D memory devices 200 and 201 depicted in FIGS. 2A-2B. FIGS. 5A-5G, 7, and 9 will be described together. It is understood that the operations shown in method 900 are not exhaustive and that other operations can be performed as well before, after, or between any of the illustrated operations. Further, some of the operations may be performed simultaneously, or in a different order than shown in FIG. 9.

Referring to FIG. 9, method 900 starts at operation 902, in which a peripheral device is formed on a first chip substrate. Method 900 proceeds to operation 904, as illustrated in FIG. 9, in which a first interconnect layer (e.g., a peripheral interconnect layer) is formed above the peripheral device. As illustrated in FIGS. 3A-3B, a peripheral device (e.g., transistors 304) can be formed on silicon substrate 302, and peripheral interconnect layer 306 can be formed above transistors 304, as described above in detail.

Method 900 proceeds to operation 906, as illustrated in FIG. 9, in which a memory stack including two memory decks one over another is formed on a second chip substrate. Method 900 proceeds to operation 908, as illustrated in FIG. 9, in which two memory strings each extending vertically through one of the two memory decks are formed. In some embodiments, forming the memory stack includes forming a common source layer vertically between the two memory decks. In some embodiments, forming the memory stack includes forming an inter-deck plug vertically between the two memory decks.

Figure 5A:
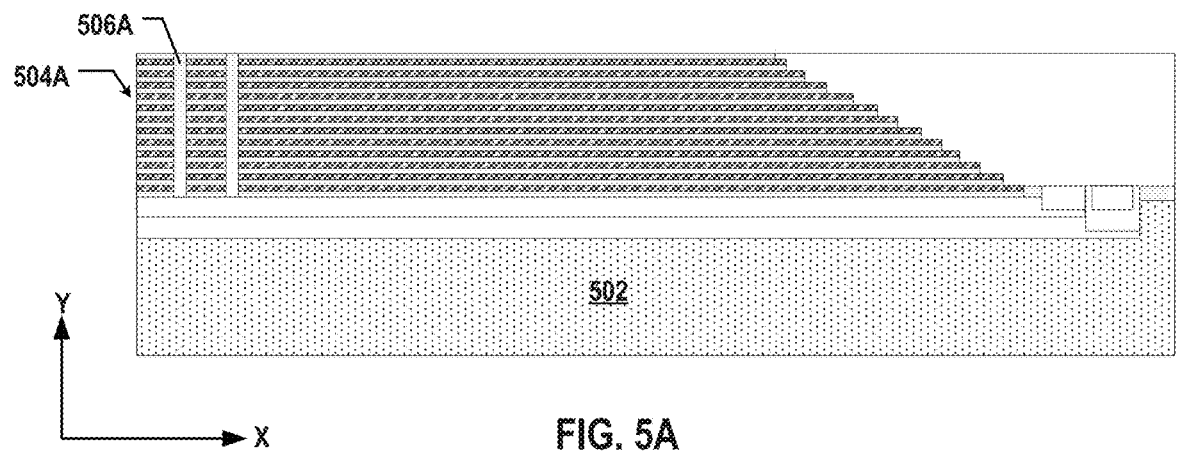
FIGS. 5A-5G illustrate fabrication processes for forming exemplary multi-deck memory array device chips, according to various embodiments of the present disclosure.

Referring to FIG. 5A, a first dielectric deck 504A including a plurality of dielectric layer pairs (e.g., silicon oxide layers and silicon nitride layers) can be formed above a silicon substrate 502 using one or more thin film deposition processes including, but not limited to, CVD, PVD, ALD, electroplating, electroless plating, or any combination thereof. NAND memory strings 506A each extending vertically through first dielectric deck 504A can be formed using the fabrication processes described above in detail.

Figure 5B:
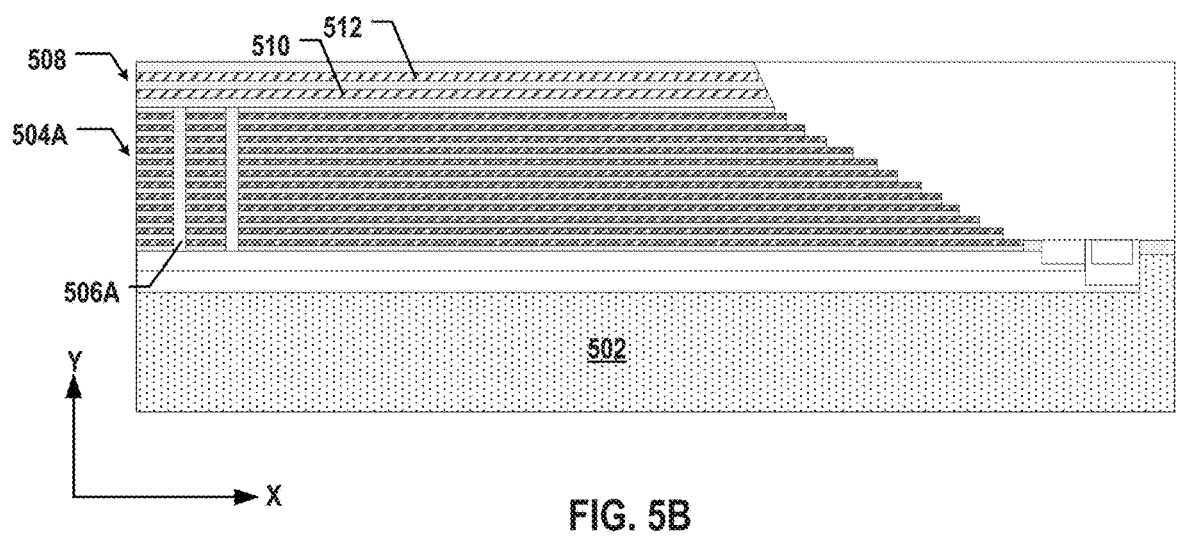

Referring to FIG. 5B, a common source layer 508 including two conductive layers 510 and 512 can be formed on first dielectric deck 504A. In some embodiments, one or more ILD layers are formed as part of common source layer 508 to electrically isolate conductive layers 510. Conductive layers 510 and 512 can be formed by depositing conductive materials, such as doped polysilicon with p-type dopants and n-type dopants, respectively, using one or more thin film deposition processes including, but not limited to, CVD, PVD, ALD, electroplating, electroless plating, or any combination thereof, followed by doping processes, such as ion implantation and/or thermal diffusion. The ILD layers of common source layer 508 can be formed by depositing dielectric materials using one or more thin film deposition processes including, but not limited to, CVD, PVD, ALD, electroplating, electroless plating, or any combination thereof.

Figure 5C:
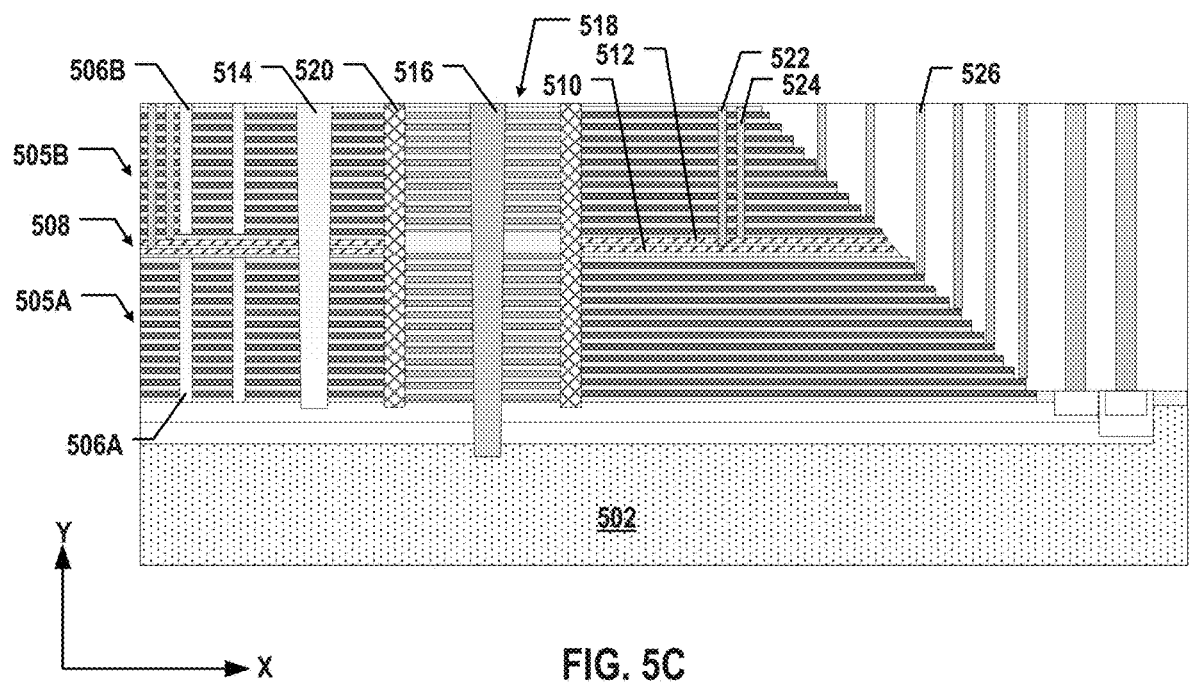

Referring to FIG. 5C, a second dielectric deck including a plurality of dielectric layer pairs (e.g., silicon oxide layers and silicon nitride layers) can be formed on common source layer 508 using one or more thin film deposition processes including, but not limited to, CVD, PVD, ALD, electroplating, electroless plating, or any combination thereof. A first memory deck 505A and a second memory deck 505B can be formed by the gate replacement process to replace first dielectric deck 504A and second dielectric deck as described above in detail. Each of first memory deck 505A and second memory deck 505B includes a plurality of conductor/dielectric layer pairs (e.g., tungsten layers and silicon oxide layers) after the gate replacement processes, according to some embodiments.

Referring to FIG. 5C, two source contacts 522 and 524 can be formed through second memory deck 505B and in contact with two conductive layers 510 and 512 in common source layer 508, respectively. Source contacts 522 and 524 can be formed by etching vertical openings using wet etching and/or dry etching processes, followed by thin film deposition processes to fill the openings with conductive materials. NAND memory strings 506B, a GLS 514, a barrier structure 520, a dielectric structure 518 of memory stack 505, a TAC 516, and local contacts such as word line contacts 526 are formed using the same fabrication processes for forming the counterparts in FIG. 4A, according to some embodiments, and will not be repeated.

Figure 5D:
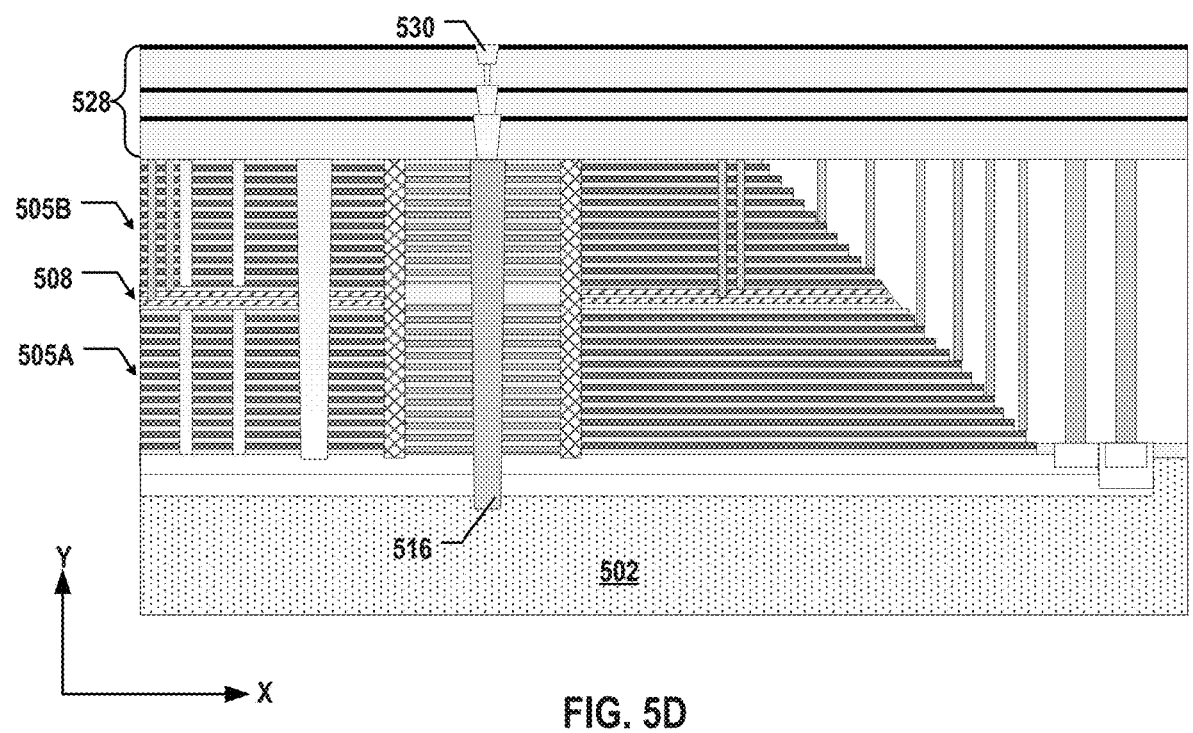
Figure 5E:
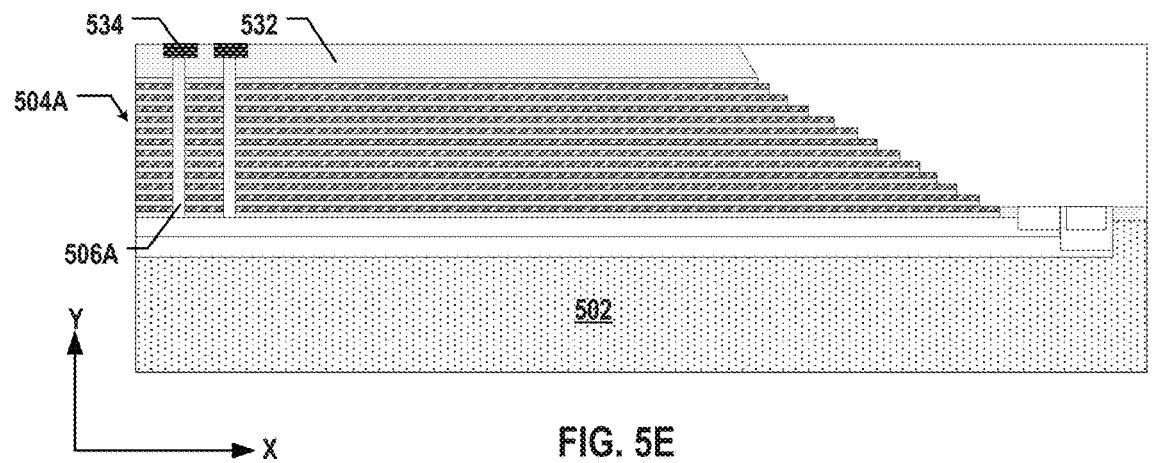
Figure 5F:
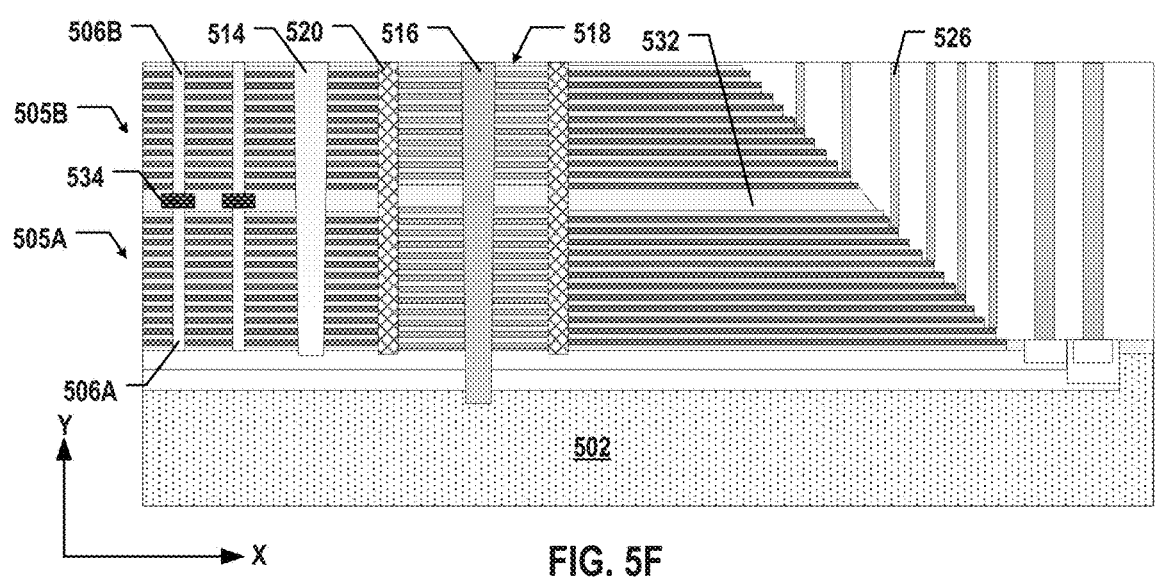

FIGS. 5E-5F illustrate another exemplary fabrication process for operations 906 and 908, which is substantially similar to the exemplary fabrication process illustrated in FIGS. 5B-5C except for the formation of IDPs 534. As illustrated in FIG. 5E, a dielectric layer 532 can be formed on first dielectric deck 504A by depositing dielectric materials using CVD, PVD, ALD, electroplating, electroless plating, or any combination thereof. IDPs 534 can be formed in dielectric layer 532 by etching openings using wet etching and/or dry etching processes, followed by filling the openings with semiconductor materials, such as undoped polysilicon, using thin film deposition processes. As illustrated in FIG. 5F, second memory deck 505B can be formed on dielectric layer 532 and above IDPs 534.

Figure 5G:
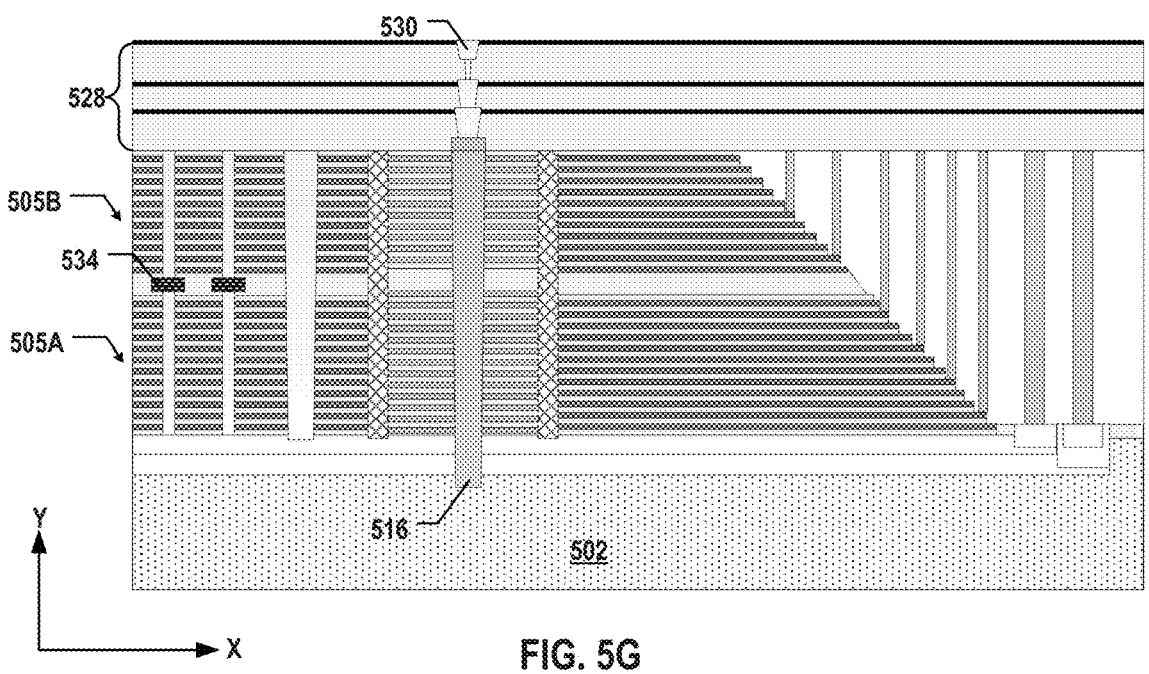

Method 900 proceeds to operation 910, as illustrated in FIG. 9, in which a second interconnect layer (e.g., an array interconnect layer) above the memory stack is formed. As illustrated in FIG. 5D or FIG. 5G, an array interconnect layer 528 including bonding contacts 530 and bonding dielectrics in its top portion can be formed above memory stack 505 using the fabrication processes described above in detail.

Method 900 proceeds to operation 912, as illustrated in FIG. 9, in which the first chip substrate and second chip substrate are bonded at a bonding interface between the first interconnect layer and the second interconnect layer. The bonding can be hybrid bonding. As illustrated in FIG. 7, array interconnect layer 528 can be bonded with peripheral interconnect layer 306, thereby forming a bonding interface. In some embodiments, a treatment process, e.g., a plasma treatment, a wet treatment, and/or a thermal treatment, is applied to the bonding surfaces prior to the bonding. After the bonding, bonding contacts 308 in peripheral interconnect layer 306 and bonding contacts 530 in array interconnect layer 528 are aligned and in contact with one another, so that the interconnects in array interconnect layer 528 are electrically connected to the interconnects in peripheral interconnect layer 306. In the bonded device, silicon substrate 502 can be either above or below silicon substrate 302.

According to one aspect of the present disclosure, a 3D memory device includes a first device chip, a second device chip, and a bonding interface. The first device chip includes a peripheral device and a first interconnect layer. The second device chip includes a substrate, two memory stacks disposed on opposite sides of the substrate, two memory strings each extending vertically through one of the two memory stacks, and a second interconnect layer. The bonding interface is formed vertically between the first interconnect layer of the first device chip and the second interconnect layer of the second device chip.

In some embodiments, the first device chip further includes a memory stack and a memory string extending vertically through the memory stack. The memory stack of the first device chip can be disposed beside, below, or above the peripheral device.

In some embodiments, the first interconnect layer includes a plurality of bonding contacts and bonding dielectrics at the bonding interface. In some embodiments, the second interconnect layer includes a plurality of bonding contacts and bonding dielectrics at the bonding interface.

In some embodiments, each of the two memory stacks of the second device chip includes a staircase structure tilting toward a center of the memory stack. The second device chip further includes two word line contacts each being in contact with one of the two memory stacks at the respective staircase structure, according to some embodiments.

In some embodiments, the first device chip further includes a first contact extending vertically through the memory stack of the first device chip. In some embodiments, the second device chip further comprises a second contact extending vertically through the substrate and the two memory stacks of the second device chip. Each of the first and second interconnect layers includes a contact electrically connecting the first contact of the first device chip and the second contact of the second device chip, according to some embodiments.

In some embodiments, the second device chip further includes another second interconnect layer disposed on the opposite side of the substrate as the second interconnect layer.

In some embodiments, the 3D memory device further includes a third device chip and a second bonding interface. The third device chip can include a memory stack, a memory string extending vertically through the memory stack, and a third interconnect layer. The second bonding interface is formed vertically between the third interconnect layer of the third device chip and the another second interconnect layer of the second device chip. In some embodiments, the 3D memory device further includes a select line configured to select between the memory string in the third device chip and one of the two memory strings in the second device chip.

According to another aspect of the present disclosure, a 3D memory device includes a first device chip, a second device chip, and a bonding interface. The first device chip includes a peripheral device and a first interconnect layer. The second device chip includes a substrate, a memory stack formed on the substrate and comprising two memory decks disposed one over another, two memory strings each extending vertically through one of the two memory decks, and a second interconnect layer. The bonding interface is formed vertically between the first interconnect layer of the first device chip and the second interconnect layer of the second device chip.

In some embodiments, the first device chip further includes a memory stack and a memory string extending vertically through the memory stack. The memory stack of the first device chip can be disposed beside, below, or above the peripheral device.

In some embodiments, the first interconnect layer includes a plurality of bonding contacts and bonding dielectrics at the bonding interface. In some embodiments, the second interconnect layer includes a plurality of bonding contacts and bonding dielectrics at the bonding interface.

In some embodiments, the second device chip further includes a common source layer disposed vertically between the two memory decks and electrically connected to the two memory strings of the second device chip. The common source layer can include two conductive layers.

In some embodiments, the second device chip further includes an inter-deck plug disposed vertically between the two memory decks and electrically connected to the two memory strings of the second device chip. The inter-deck plug can include a semiconductor plug.

In some embodiments, the first device chip further includes a first contact extending vertically through the memory stack of the first device chip. In some embodiments, the second device chip further includes a second contact extending vertically through the two memory decks of the second device chip. Each of the first and second interconnect layers includes a contact electrically connecting the first contact of the first device chip and the second contact of the second device chip, according to some embodiments.

According to still another aspect of the present disclosure, a method for forming a 3D memory device is disclosed. A peripheral device is formed on a first chip substrate. A first interconnect layer is formed above the peripheral device on the first chip substrate. A first memory stack is formed on a first side of a second chip substrate. A first memory string extending vertically through the first memory stack is formed. A second memory stack is formed on a second side opposite to the first side of the second chip substrate. A second memory string extending vertically through the second memory stack is formed. A second interconnect layer is formed above one of the first and second memory stacks. The first chip substrate and the second chip substrate are bonded at a bonding interface between the first interconnect layer and the second interconnect layer.

In some embodiments, the bonding includes hybrid bonding.

According to yet another aspect of the present disclosure, a method for forming a 3D memory device is disclosed. A peripheral device is formed on a first chip substrate. A first interconnect layer is formed above the peripheral device on the first chip substrate. A memory stack including two memory decks formed one over another is formed on a second chip substrate. Two memory strings each extending vertically through one of the two memory decks are formed. A second interconnect layer is formed above the memory stack. The first chip substrate and the second chip substrate are bonded at a bonding interface between the first interconnect layer and the second interconnect layer.

In some embodiments, the bonding includes hybrid bonding.

In some embodiments, forming the memory stack includes forming a common source layer vertically between the two memory decks. In some embodiments, forming the memory stack includes forming an inter-deck plug vertically between the two memory decks.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:
1. A method for forming a three-dimensional (3D) memory device, comprising:
   forming a peripheral device on a first chip substrate;
   forming a first interconnect layer above the peripheral device on the first chip substrate;

forming a memory stack comprising two memory decks formed one over another on a second chip substrate, wherein each memory decks has a memory string extending vertically through it;

forming a second interconnect layer above the memory stack; and bonding the first chip substrate and the second chip substrate at a bonding interface between the first interconnect layer and the second interconnect layer, wherein the bonding includes hybrid bonding.

2. The method of claim 1, further comprising forming a common source layer vertically between the two memory decks.

3. The method of claim 2, wherein the common source layer comprises two conductive layers.

4. The method of claim 1, further comprising forming an inter-deck plug vertically between the two memory decks.

5. The method of claim 4, wherein the inter-deck plug comprises a semiconductor plug.

6. The method of claim 1, further comprising forming another memory stack and another memory string extending vertically through the another memory stack beside, below, or above the peripheral device on the first chip substrate.

7. The method of claim 6, further comprising:
   forming a first contact extending vertically through the another memory stack; and
   forming a second contact extending vertically through the two memory decks,
   wherein the first contact is electrically connected to the second contact after the bonding through the first interconnect layer and the second interconnect layer.

8. A three-dimensional (3D) memory device, comprising:
   a first device chip, comprising:
      a first interconnect layer;
      a peripheral device; and
      a first memory stack;
   a second device chip, comprising:
      a second memory stack comprising two memory decks disposed one over another;
      two memory strings each extending vertically through one of the two memory decks; and
      a second interconnect layer; and
   a bonding interface formed vertically between the first interconnect layer of the first device chip and the second interconnect layer of the second device chip.

9. The 3D memory device of claim 8, wherein the first device chip further comprises another memory string extending vertically through the first memory stack.

10. The 3D memory device of claim 9, wherein the first memory stack of the first device chip is disposed beside, below, or above the peripheral device.

11. The 3D memory device of claim 8, wherein the first interconnect layer comprises a plurality of bonding contacts and bonding dielectrics at the bonding interface.

12. The 3D memory device of claim 8, wherein the second device chip further comprises a common source layer disposed vertically between the two memory decks and electrically connected to the two memory strings of the second device chip.

13. The 3D memory device of claim 12, wherein the common source layer comprises two conductive layers.

14. The 3D memory device of claim 8, wherein the second device chip further comprises an inter-deck plug disposed vertically between the two memory decks and electrically connected to the two memory strings of the second device chip.

15. The 3D memory device of claim 14, wherein the inter-deck plug comprises a semiconductor plug.

16. The 3D memory device of claim 8, wherein the second interconnect layer comprises a plurality of bonding contacts and bonding dielectrics at the bonding interface.

17. The 3D memory device of claim 9, wherein the first device chip further comprises a first contact extending vertically through the first memory stack of the first device chip.

18. The 3D memory device of claim 17, wherein the second device chip further comprises a second contact extending vertically through the two memory decks of the second device chip.

19. The 3D memory device of claim 18, wherein each of the first and second interconnect layers comprises a contact electrically connecting the first contact of the first device chip and the second contact of the second device chip.

20. A three-dimensional (3D) memory device, comprising:
   a first device chip, comprising:
      a first interconnect layer;
      a first memory stack; and
      a contact extending vertically through the first memory stack of the first device chip;
   a second device chip, comprising:
      a second memory stack comprising two memory decks disposed one over another;
      two memory strings each extending vertically through one of the two memory decks; and
      a second interconnect layer; and
   a bonding interface formed vertically between the first interconnect layer of the first device chip and the second interconnect layer of the second device chip.

* * * * *